(12) United States Patent
Kao

(10) Patent No.: US 12,369,376 B2
(45) Date of Patent: Jul. 22, 2025

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventor: Ching-Hung Kao, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 607 days.

(21) Appl. No.: 17/576,910

(22) Filed: Jan. 14, 2022

(65) Prior Publication Data

US 2023/0039627 A1    Feb. 9, 2023

Related U.S. Application Data

(60) Provisional application No. 63/230,545, filed on Aug. 6, 2021.

(51) Int. Cl.
*H10D 64/01*  (2025.01)
*H10D 64/66*  (2025.01)

(52) U.S. Cl.
CPC .......... *H10D 64/01* (2025.01); *H10D 64/017* (2025.01); *H10D 64/018* (2025.01); *H10D 64/66* (2025.01)

(58) Field of Classification Search
CPC .................. H01L 29/401; H01L 29/49; H01L 29/66545; H01L 29/66553; H01L 29/42376; H01L 29/4238; H10D 64/017; H10D 64/018; H10D 64/518; H10D 64/519; H10D 84/0179; H10D 84/0142
See application file for complete search history.

(56) References Cited

U.S. PATENT DOCUMENTS

| | | |
|---|---|---|
| 2017/0345926 A1 | 11/2017 | Hsiao et al. |
| 2018/0301348 A1 | 10/2018 | Lin |
| 2020/0058559 A1 | 2/2020 | Yoo et al. |
| 2021/0043463 A1 | 2/2021 | Lin |

FOREIGN PATENT DOCUMENTS

| | | |
|---|---|---|
| JP | 2010028144 A | 2/2010 |
| KR | 10-2020-0020425 A | 2/2020 |
| TW | 1264820 B | 10/2006 |

*Primary Examiner* — Bac H Au
(74) *Attorney, Agent, or Firm* — STUDEBAKER BRACKETT PLLC

(57) ABSTRACT

In a method of manufacturing a semiconductor device, first and second fin structures are formed over a substrate, an isolation insulating layer is formed over the substrate, a gate structure is formed over channel regions of the first and second fin structures, source/drain regions of the first and second fin structure are recessed, and an epitaxial source/drain structure is formed over the recessed first and second fin structures. The epitaxial source/drain structure is a merged structure having a merger point, and a height of a bottom of the merger point from an upper surface of the isolation insulating layer is 50% or more of a height of the channel regions of the first and second fin structures from the upper surface of the isolation insulating layer.

20 Claims, 34 Drawing Sheets

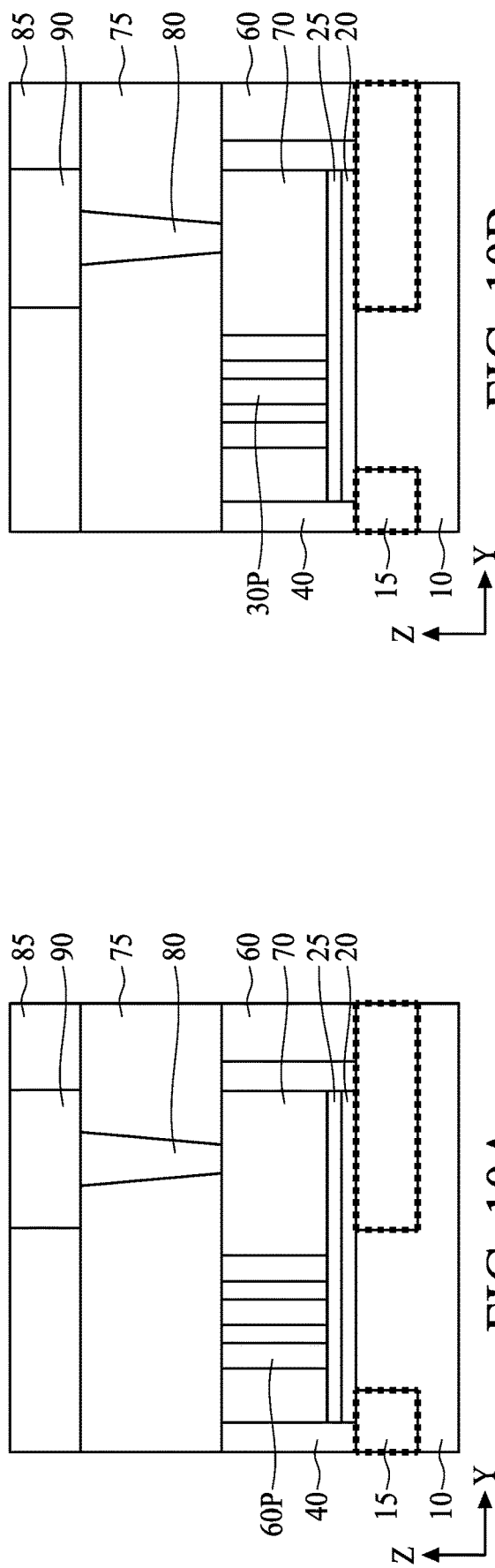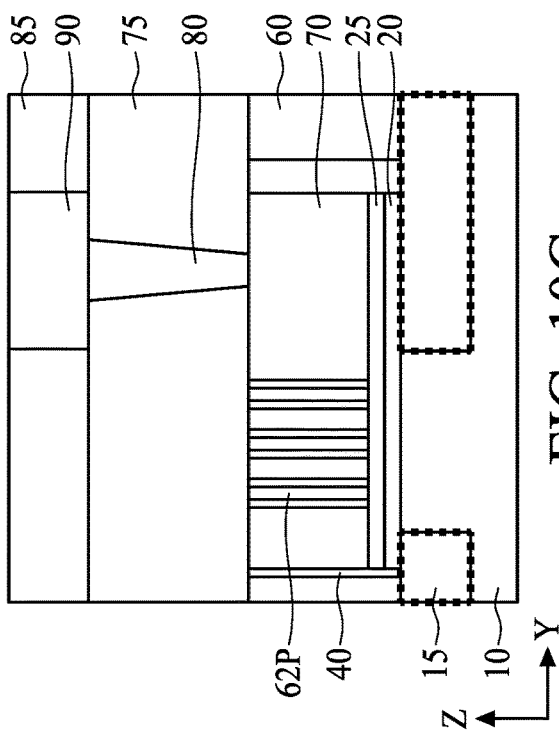
FIG. 10A
FIG. 10B
FIG. 10C

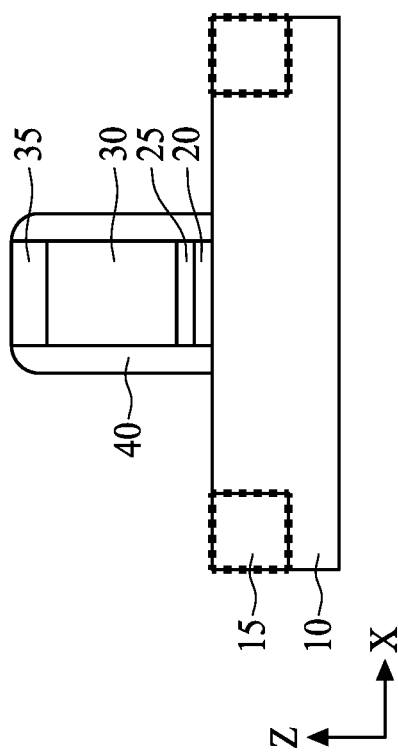
FIG. 22A
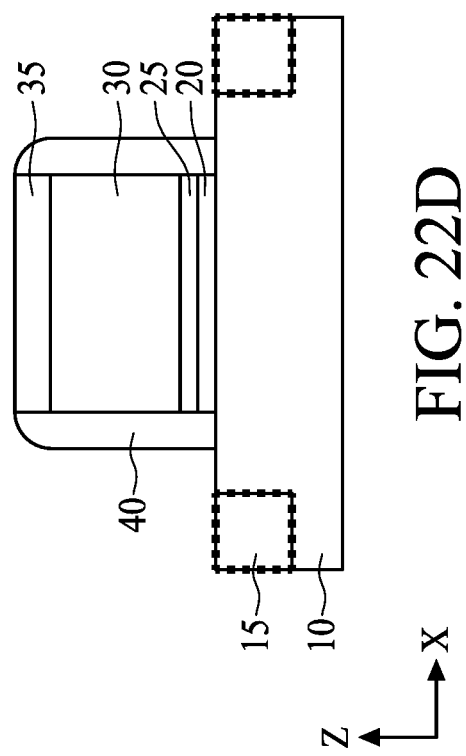
FIG. 22B
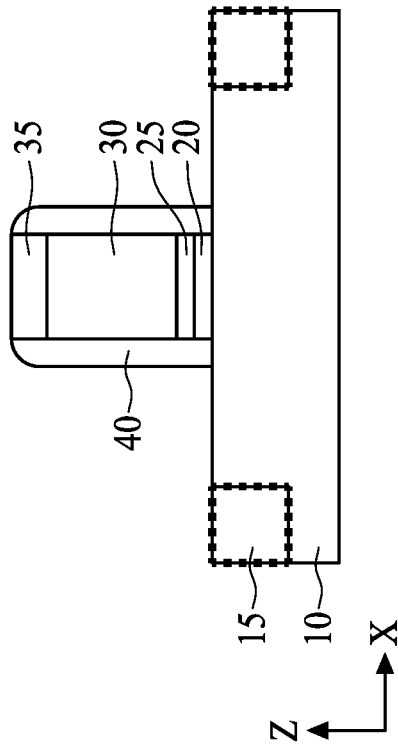
FIG. 22C
FIG. 22D

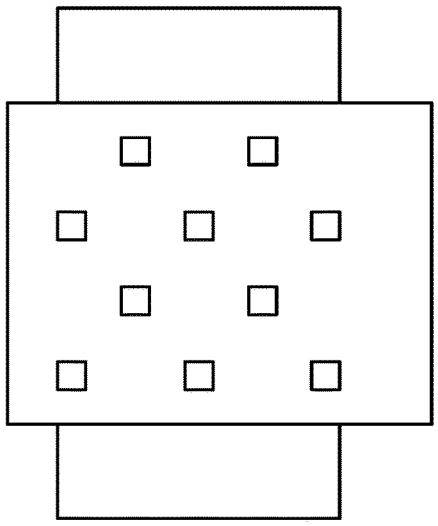
FIG. 31A
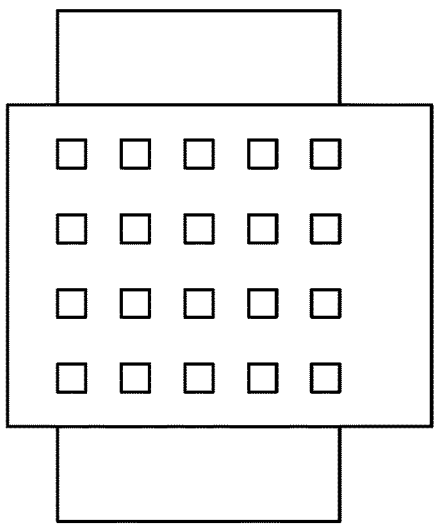
FIG. 31B
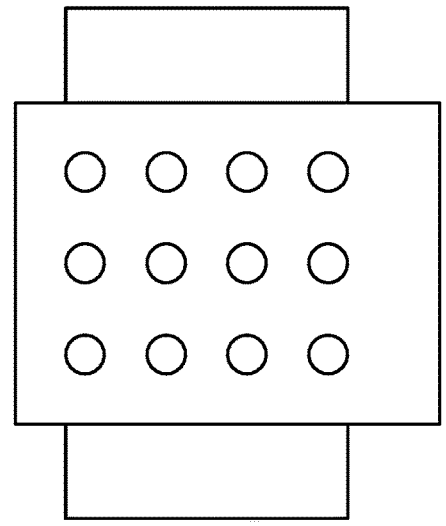
FIG. 31C
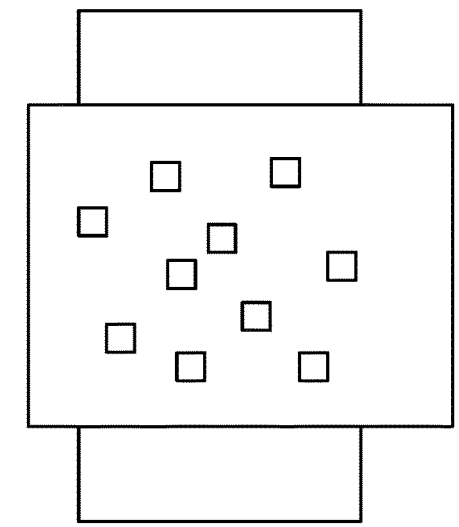
FIG. 31D
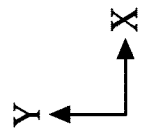

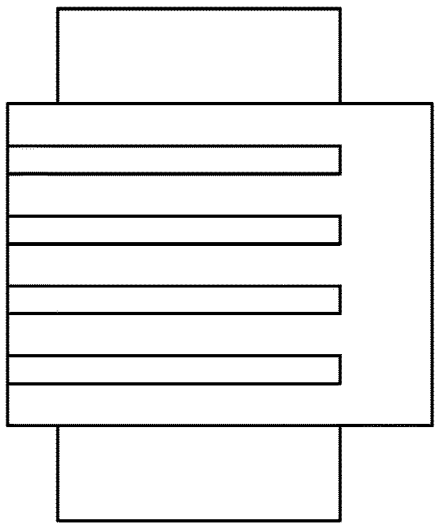
FIG. 34A
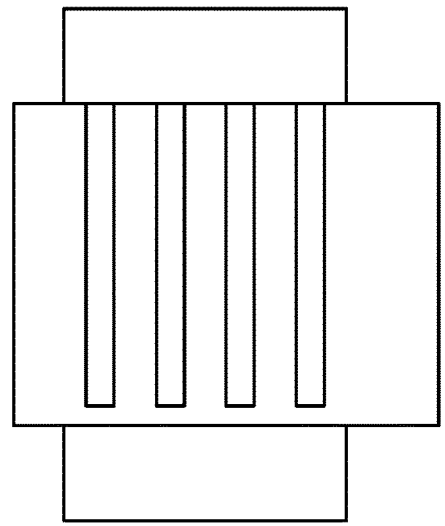
FIG. 34B
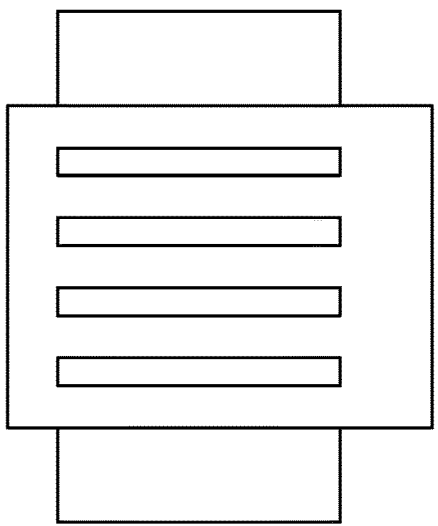
FIG. 34C
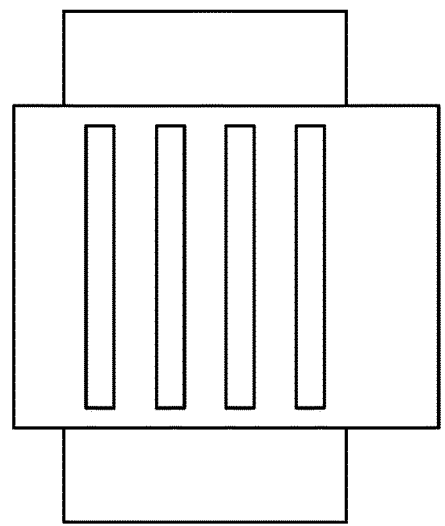
FIG. 34D
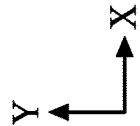

METHOD OF MANUFACTURING A SEMICONDUCTOR DEVICE AND A SEMICONDUCTOR DEVICE

RELATED APPLICATION

This application claims priority to U.S. Provisional Patent Application No. 63/230,545 filed Aug. 6, 2021, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method. In the manufacturing operation, one or more planarization operations, such as a chemical mechanical polishing (CMP) process, are used to flatten a topography of a dielectric or conductive layer caused by underlying structures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10A, 10B and 10C show various view of one of the sequential manufacturing process of a semiconductor device according to an embodiment of the present disclosure.

FIGS. 22A, 22B, 22C and 22D shows various view of one of the sequential manufacturing process of a semiconductor device according to an embodiment of the present disclosure.

FIGS. 31A, 31B, 31C, 31D and 31E show plan views of a semiconductor device according to embodiments of the present disclosure.

FIGS. 34A, 34B, 34C and 34D show plan views of a semiconductor device according to embodiments of the present disclosure.

DETAILED DESCRIPTION

Figure 1A:
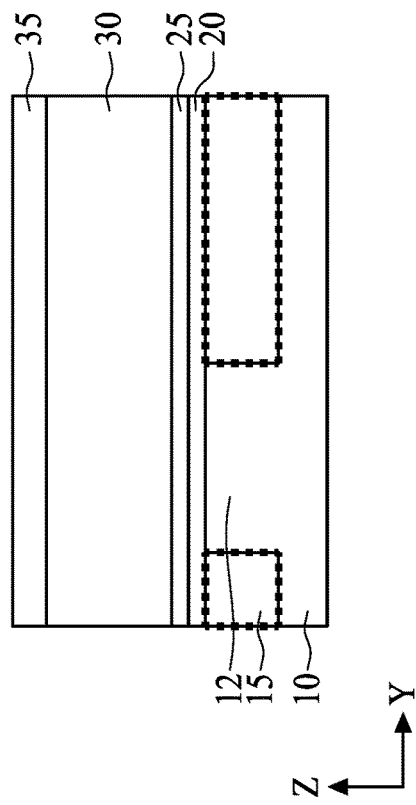
FIGS. 1A, 1B, 1C and 1D show various view of one of the sequential manufacturing process of a semiconductor device according to an embodiment of the present disclosure.
Figure 1B:
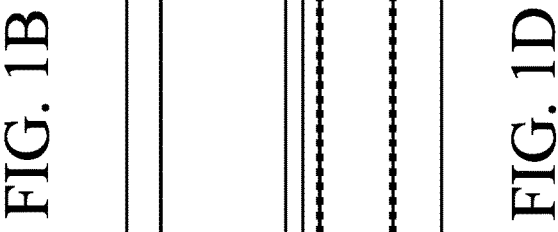
Figure 1C:
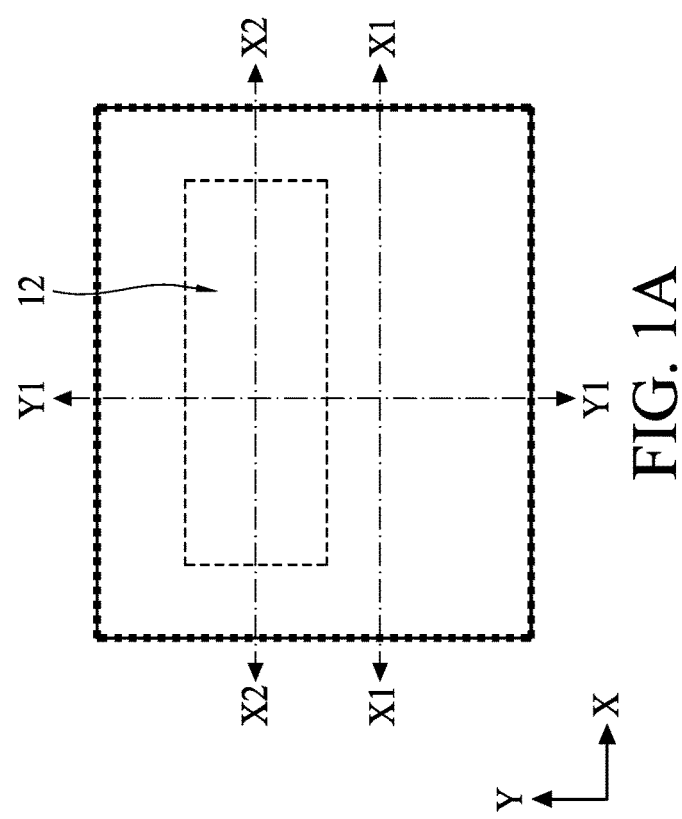
Figure 1D:
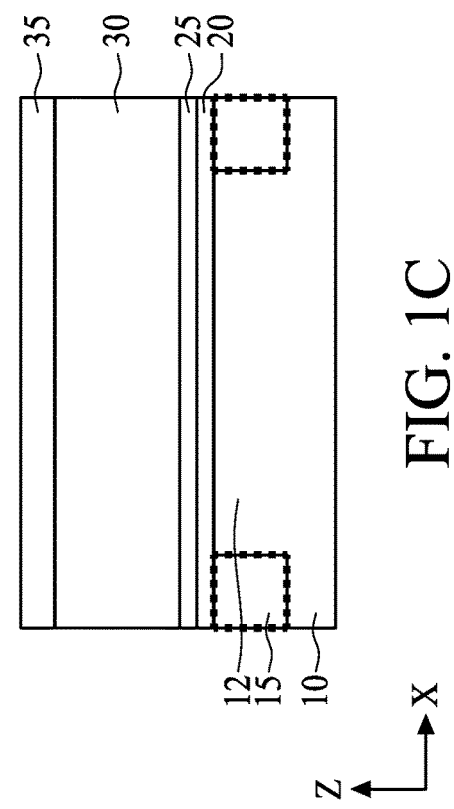
Figure 2B:
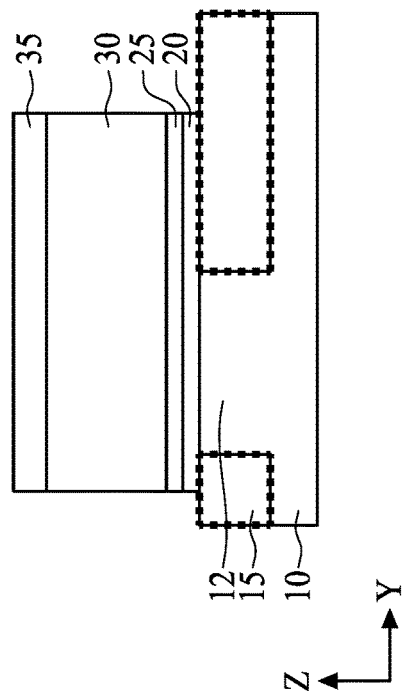
FIGS. 2A, 2B, 2C and 2D show various view of one of the sequential manufacturing process of a semiconductor device according to an embodiment of the present disclosure.
Figure 2D:
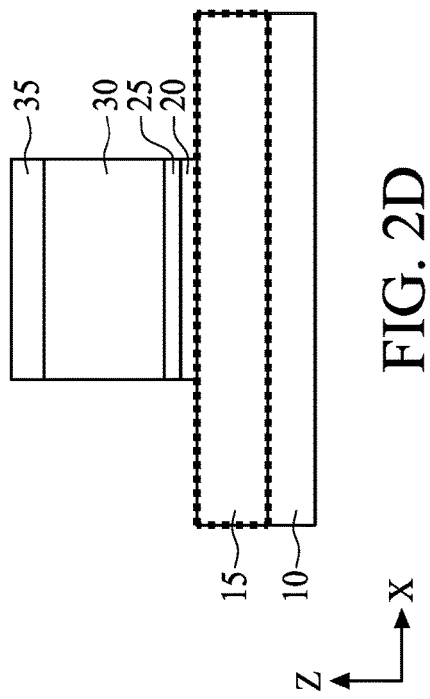
Figure 2A:
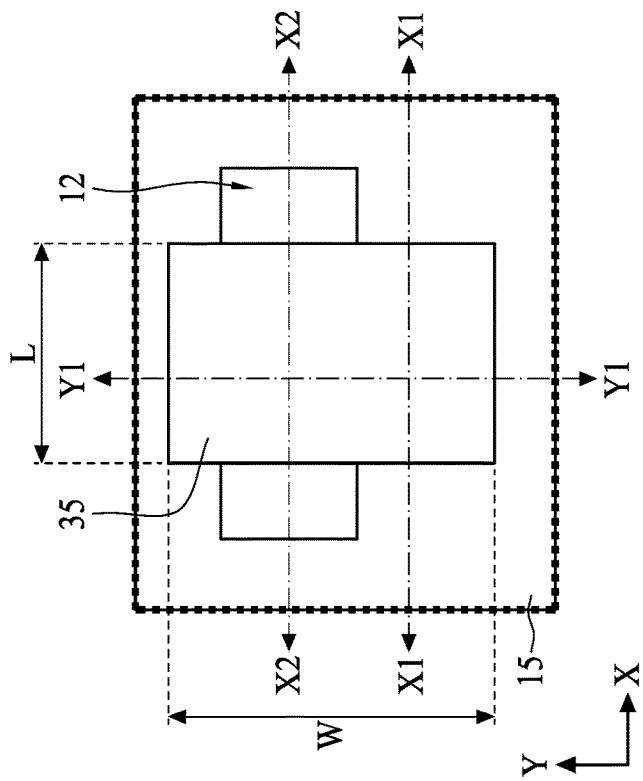
Figure 2C:
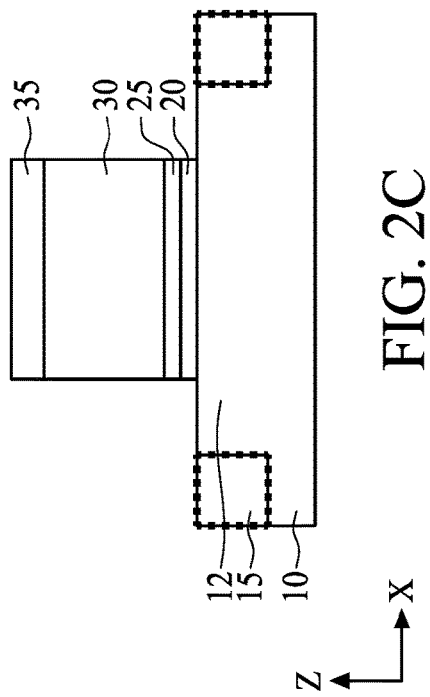
Figure 3B:
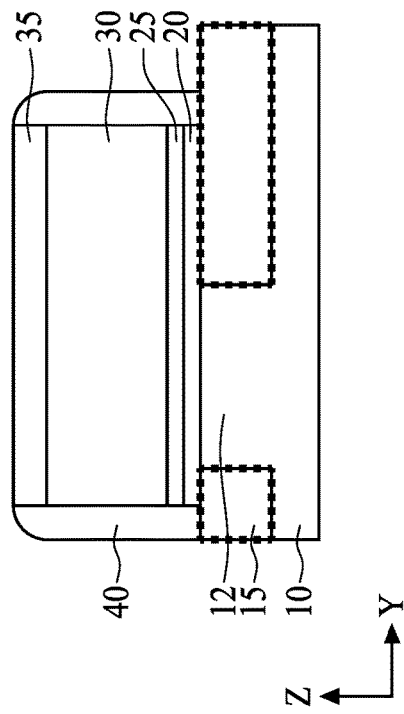
FIGS. 3A, 3B, 3C and 3D show various view of one of the sequential manufacturing process of a semiconductor device according to an embodiment of the present disclosure.
Figure 3D:
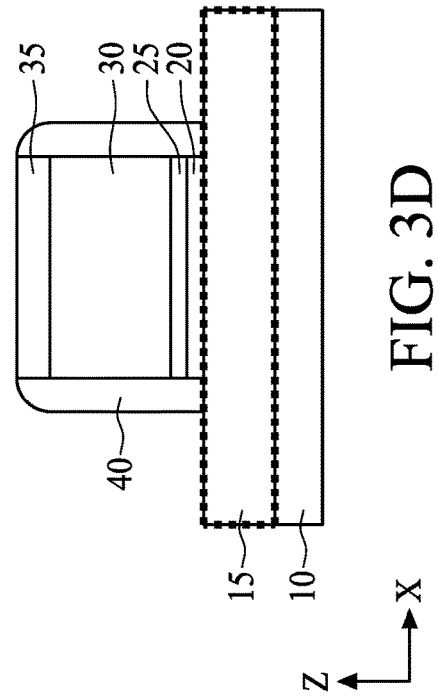
Figure 3A:
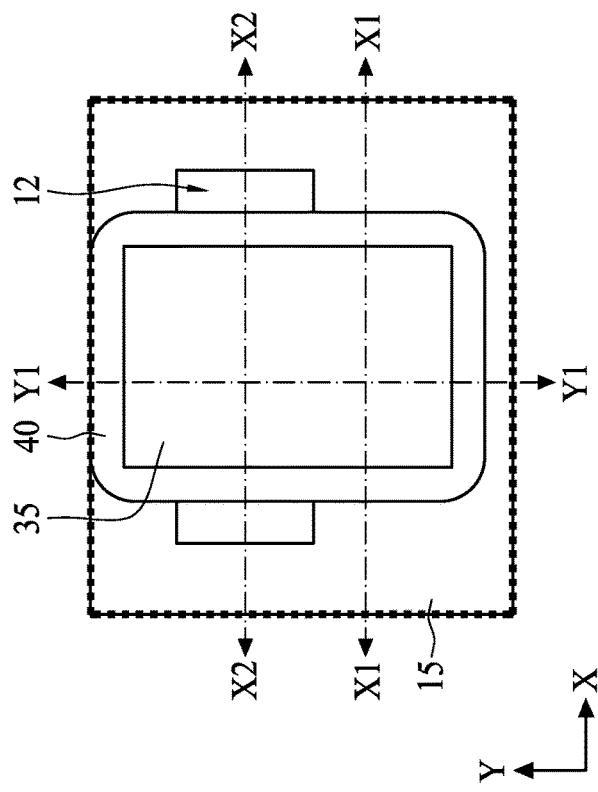
Figure 3C:
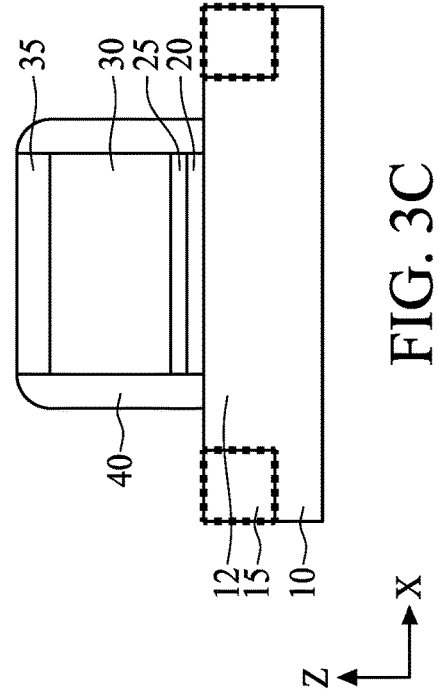
Figure 4B:
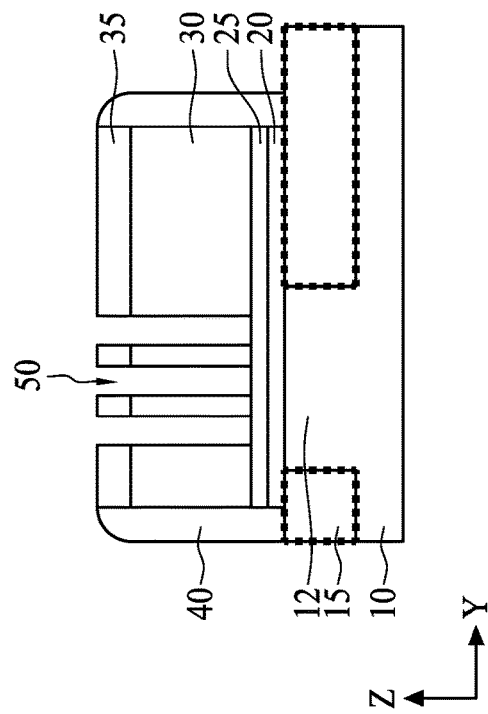
FIGS. 4A, 4B, 4C and 4D show various view of one of the sequential manufacturing process of a semiconductor device according to an embodiment of the present disclosure.
Figure 4D:
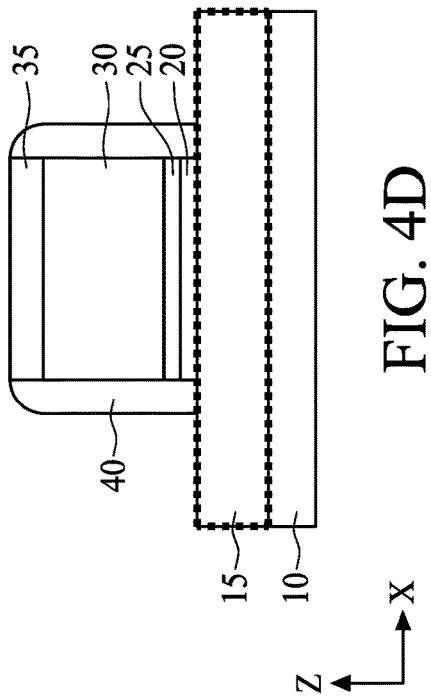
Figure 4A:
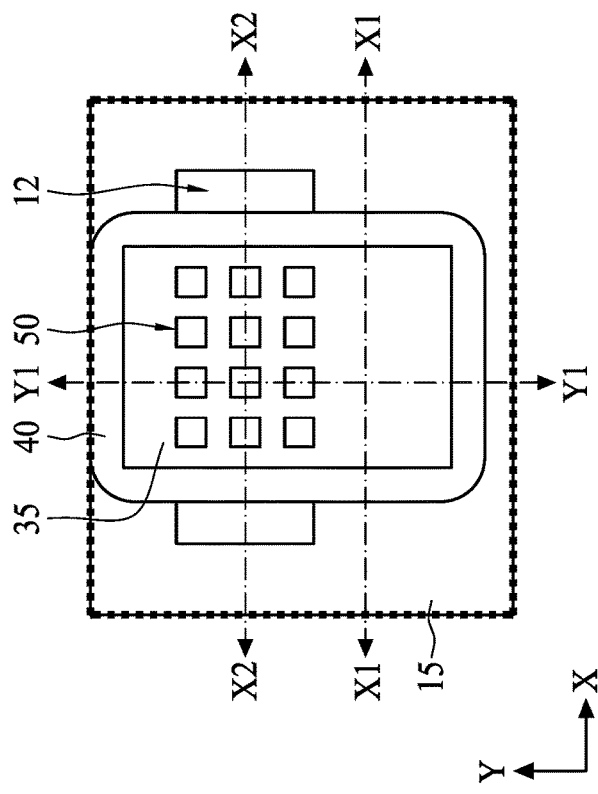
Figure 4C:
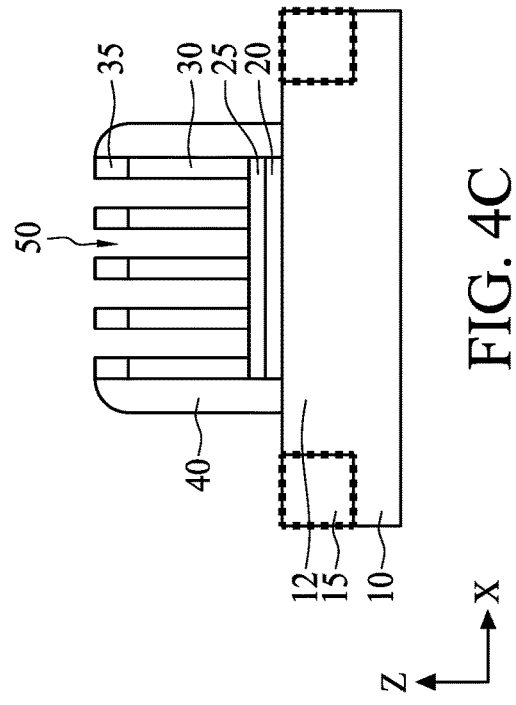

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted. The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

Disclosed embodiments relate to a semiconductor device and its manufacturing method, in particular, gate structures of a planar field effect transistor (FET). The embodiments such as those disclosed herein are generally applicable not only to planar FETs but also other FETs or semiconductor devices (e.g., bipolar transistors). For example, the gate structures of the present disclosure can be used in a complementary metal oxide semiconductor (CMOS) device, an analog semiconductor device, a high-voltage semiconductor device, a bipolar CMOS (BiCMOS), and a CMOS image sensor.

In a gate replacement process for manufacturing a metal gate structure, one or more planarization operations, such as a chemical mechanical polishing (CMP) operation, are used. One of the issues in a CMP operation is "dishing" which is an undesirable concave surface of the polished surface. In particular, excess dishing is often observed in large patterns. When the metal gate structure has such excess dishing, device performance may be degraded. The techniques disclosed herein can minimize the dishing in a CMP operation used a gate replacement process.

FIGS. 1A-10A show views of various stages of a sequential manufacturing operation of a semiconductor device according to the present disclosure. It is understood that additional operations may be provided before, during, and after the processes shown by FIGS. 1A-10A, and some of the operations described below can be replaced or eliminated for additional embodiments of the method. The order of the operations/processes may be interchangeable. In FIGS. 1A-9D, the "A" figures (FIGS. 1A, 2A, . . . ) are plan views (a layout or a top view), the "B" figures (FIGS. 1B, 2B, . . . ) are cross sectional views along Y1-Y1 line in the "A" figures, the "C" figures (FIGS. 1C, 2C, . . . ) are cross sectional views along X1-X1 line in the "A" figures, and the "D" figures (FIGS. 1D, 2D, . . . ) are cross sectional views along X2-X2 line in the "A" figures.

As shown in FIGS. 1A-1D, an isolation structure 15, such as a shallow trench isolation (STI), is formed in a semiconductor substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on-insulator) substrate. Amorphous substrates, such as amorphous Si or amorphous SiC; or insulating material, such as silicon oxide may also be used as the substrate 10. The substrate 10 may include various regions that have been suitably doped with impurities (e.g., p-type or n-type conductivity).

In some embodiments, the isolation structure 15 defines (e.g., surrounds) an active area 12 including a channel region and a source/drain region. In some embodiments, the isolation structure 15 includes one or more layers of insulating materials such as silicon oxide, silicon oxynitride, silicon nitride, SiOC, SiCN or SiOCN.

Further, as shown in FIGS. 1A-1D, a gate dielectric layer 20 is formed over the active region 12 and the isolation structure 15. The gate dielectric layer 20 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 20 is in a range from about 1 nm to about 20 nm in some embodiments, and is in a range from about 2 nm to about 10 nm in other embodiments.

Further, as shown in FIGS. 1A-1D, a cap layer 25 is formed over the gate dielectric layer 20. The cap layer 25 includes one or more layers of conductive material. In some embodiments, the cap layer 25 includes one or more of TiN, TaN, TaAlC, TiC, TaC, TiAl, TiSi, TaSi or TiAlC, or other suitable materials. In some embodiments, the cap layer 25 is made of TiN. The thickness of the cap layer 25 is in a range from about 1 nm to about 20 nm in some embodiments, and is in a range from about 2 nm to about 10 nm in other embodiments. The cap layer 25 is formed by, for example, CVD, PVD including sputtering, ALD or other suitable methods, and/or combinations thereof.

Further, a sacrificial gate electrode layer 30 is formed over the cap layer 25 and then a hard mask layer 35 is formed over the sacrificial gate electrode layer 30, as shown in FIGS. 1A-1D. In some embodiments, the sacrificial gate electrode layer 30 includes polysilicon or amorphous silicon. The thickness of the sacrificial gate electrode layer 30 is in a range from about 10 nm to about 200 nm in some embodiments, and is in a range from about 50 nm to about 100 nm in other embodiments. The sacrificial gate electrode layer 30 is formed by, for example, CVD or other suitable methods, and/or combinations thereof.

The hard mask layer 35 includes one or more dielectric layers, such as silicon oxide, silicon nitride, SiON or other suitable material. In some embodiments, the hard mask layer 35 includes a pad oxide (e.g., silicon oxide) layer and a silicon nitride mask layer formed on the pad oxide layer. The hard mask layer 35 is formed by CVD or other suitable process. The thickness of the hard mask layer 35 is in a range from about 5 nm to about 100 nm in some embodiments, and is in a range from about 10 nm to about 50 nm in other embodiments.

Then, as shown in FIGS. 2A-2D, a sacrificial gate structure is formed by using a patterning operation including lithography and etching operations. In some embodiments, the area of the sacrificial gate structure in plan view is equal to or more than about 3.0 $\mu m^2$. In some embodiments, the length along the X direction (source-to-drain direction) of the sacrificial gate structure in plan view is L and the width along the Y direction is W and the area L×W≥3.0 $\mu m^2$. In other embodiments, L×W≥10.0 $\mu m^2$. When the area of the sacrificial gate structure is this range, an excess dishing may be observed in the subsequent metal CMP operation. In some embodiments, the area L×W≤1000 $\mu m^2$. In some embodiments, the length L is equal to or more than about 0.5 $\mu m$ and in other embodiments, the length L is equal to or more than about 1.0 $\mu m$.

Next, as shown in FIGS. 3A-3D, a gate sidewall spacer 40 is formed on sidewalls of the sacrificial gate structure. One or more insulating material layers for the gate sidewall spacer 40 are formed over the sacrificial gate structure. The insulating material layer is deposited in a conformal manner so that it is formed to have substantially equal thicknesses on vertical surfaces, such as the sidewalls, horizontal surfaces, and the top of the sacrificial gate structure, respectively. In some embodiments, the insulating material layer has a thickness in a range from about 10 nm to about 50 nm. The insulating material layer includes one or more of SiN, SiON and SiCN or any other suitable dielectric material. The insulating material layer can be formed by ALD or CVD, or any other suitable method. Next, horizontal portions of the insulating material layer are removed by anisotropic etching, thereby forming the gate sidewall spacer 40 as shown in FIGS. 3A-3D. In some embodiments, the gate sidewall spacer 40 includes two to four layers of different insulating materials.

In some embodiments, before and/or after the gate sidewall spacer 40 is formed, one or more ion implantation operations are performed to the source/drain regions of the active region 12. In some embodiments, before and/or after the gate sidewall spacer 40 is formed, one or more source/drain epitaxial layers are formed over the source/drain regions of the active region 12.

Then, as shown in FIGS. 4A-4D, one or more openings 50 (holes, slots, or trenches) are formed in the sacrificial gate electrode layer 30 by using a patterning operation including lithography and etching operations. In some embodiments, an etching operation of the sacrificial gate electrode layer 30 substantially stops at the cap layer 25. Thus, the cap layer 25 is exposed at the bottoms of the openings 50. In some embodiments, the openings 50 are formed only above the active (channel) region 12. In other embodiments, the openings 50 are formed above the active region 12 and above the isolation structure 15. In some embodiments, the openings 50 have a tapered shape having a top larger than a bottom.

Figure 5B:
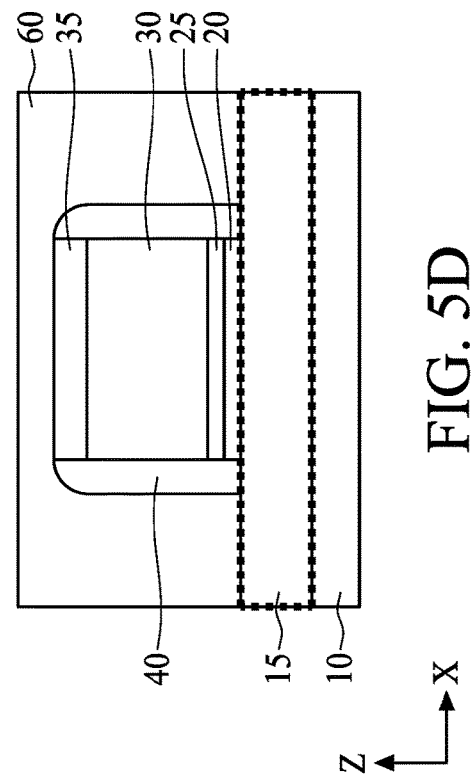
FIGS. 5A, 5B, 5C and 5D show various view of one of the sequential manufacturing process of a semiconductor device according to an embodiment of the present disclosure.
Figure 5D:
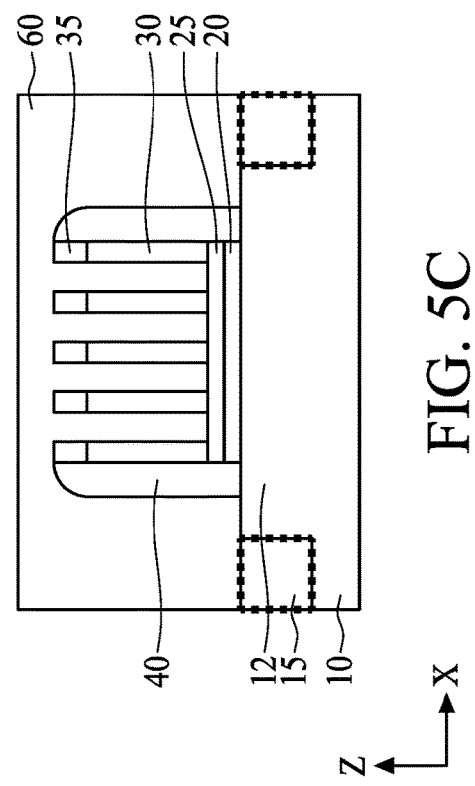
Figure 5A:
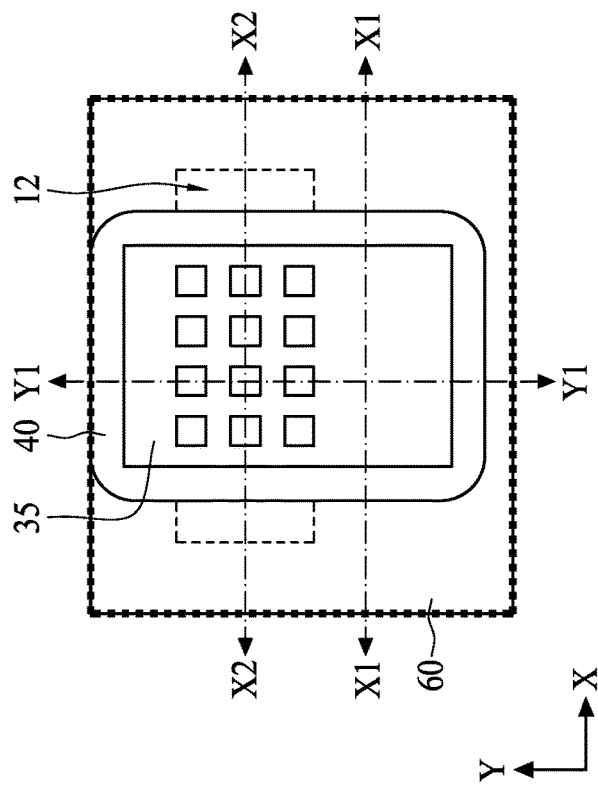
Figure 5C:
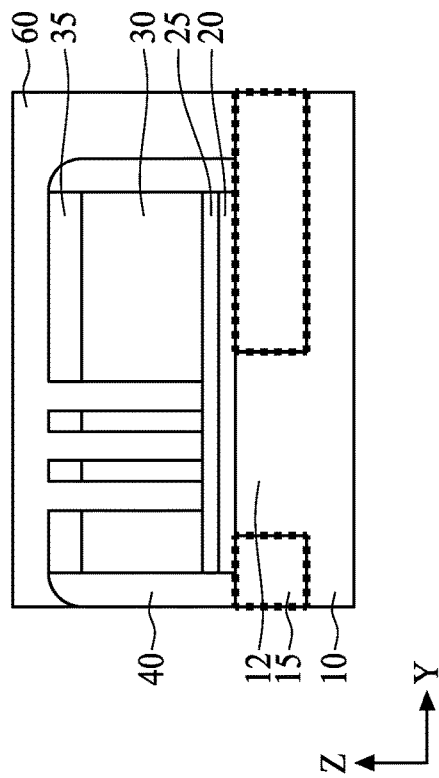

Next, as shown in FIGS. 5A-5D, a first interlayer dielectric (ILD) layer 60 is formed over the sacrificial gate structure and substrate 10 by CVD or other suitable methods. The first ILD layer 60 is one or more layers of insulating material. In one embodiment, an etching stop layer made of silicon nitride is formed by CVD before forming the first ILD layer 60. The materials for the ILD layer 60 include compounds comprising Si, O, C and/or H, such as silicon oxide, SiCOH and SiOC. As shown in FIGS. 5A-5C, the first ILD layer 60 (and the etching stop layer) fully fills the openings 50.

Figure 6B:
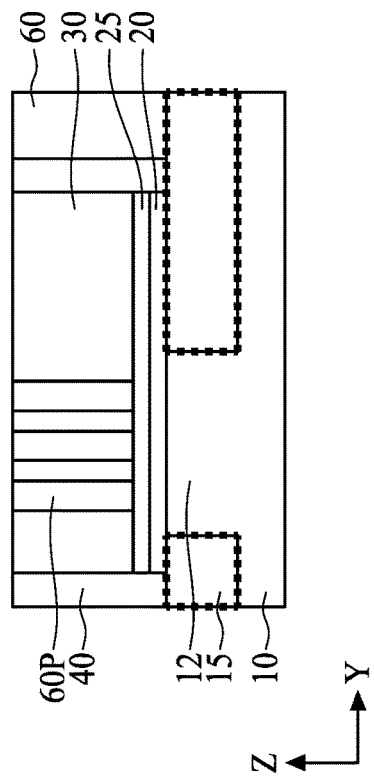
FIGS. 6A, 6B, 6C and 6D show various view of one of the sequential manufacturing process of a semiconductor device according to an embodiment of the present disclosure.
Figure 6D:
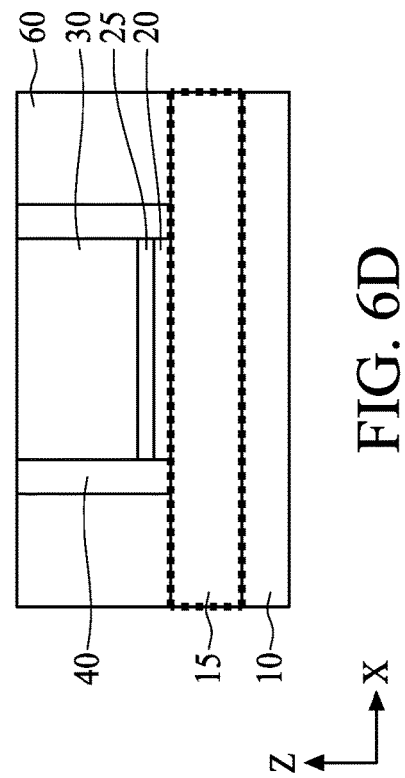
Figure 6A:
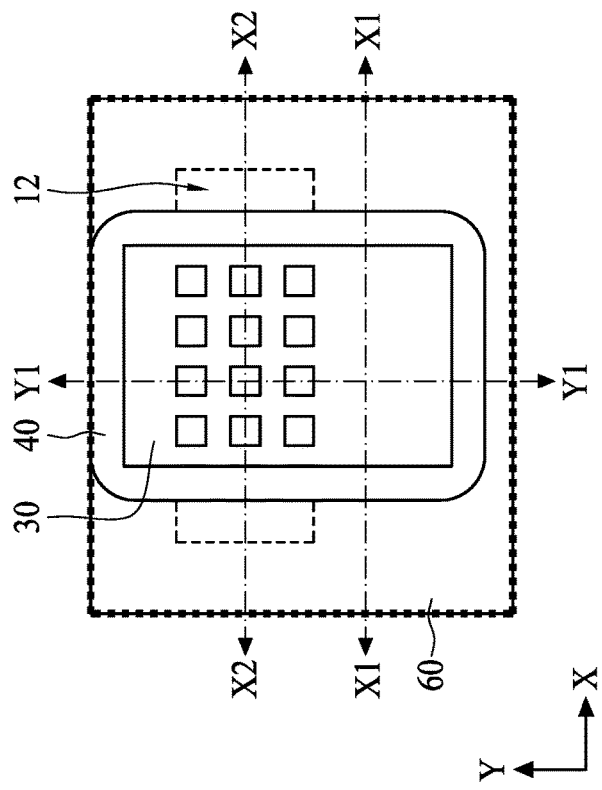
Figure 6C:
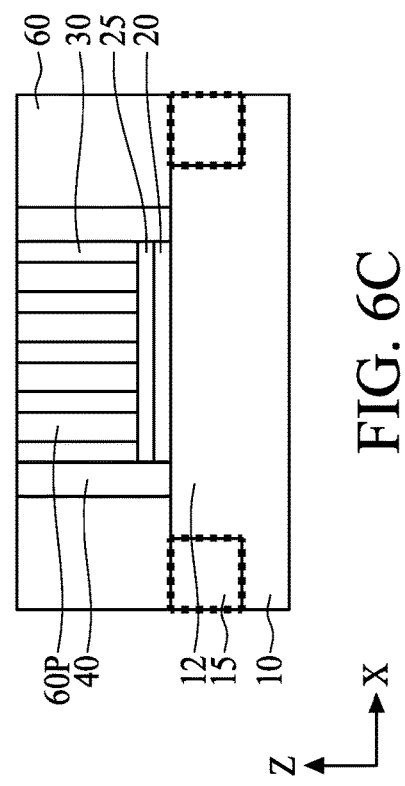
Figure 7A:
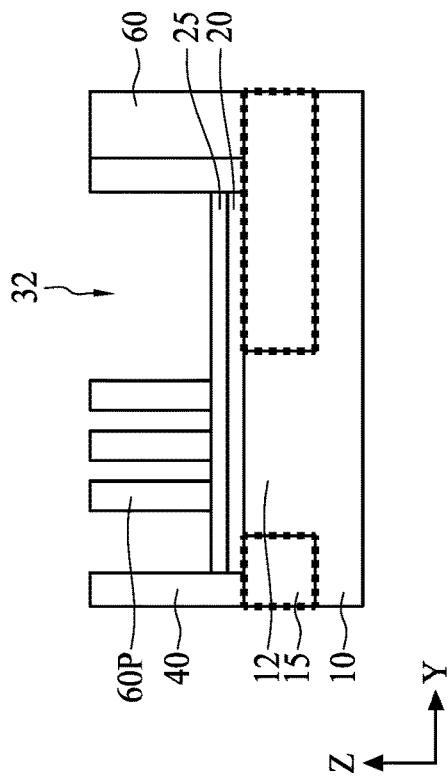
FIGS. 7A, 7B, 7C and 7D show various view of one of the sequential manufacturing process of a semiconductor device according to an embodiment of the present disclosure.
Figure 7B:
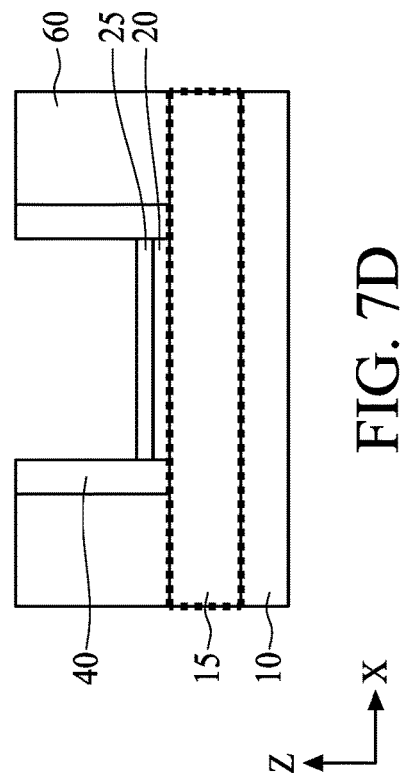
Figure 7C:
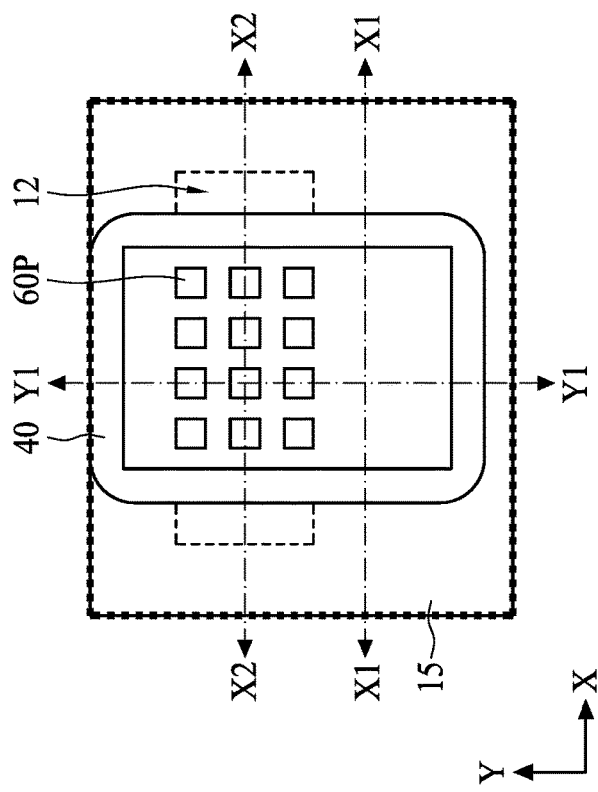
Figure 7D:
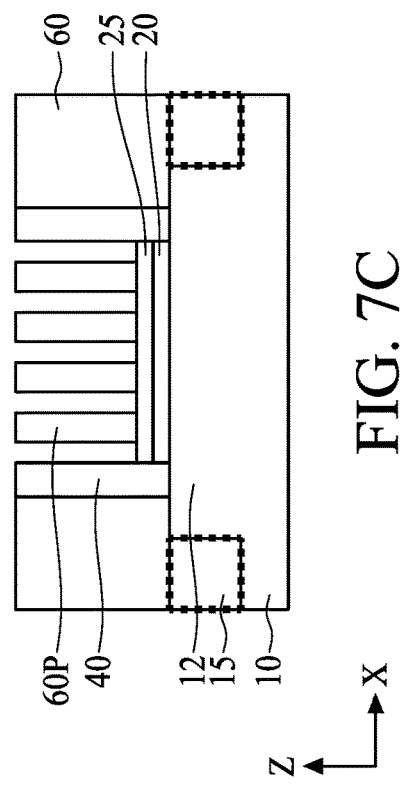
Figure 8A:
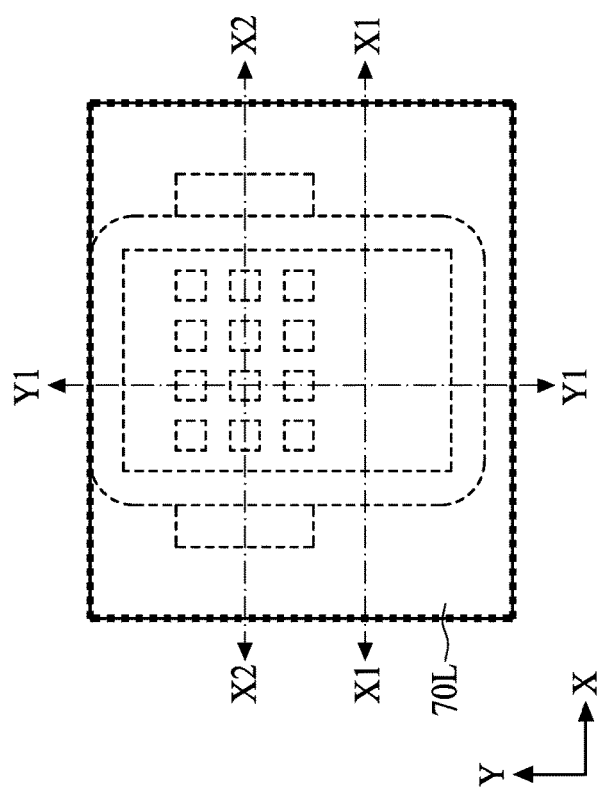
FIGS. 8A, 8B, 8C and 8D show various view of one of the sequential manufacturing process of a semiconductor device according to an embodiment of the present disclosure.
Figure 8B:
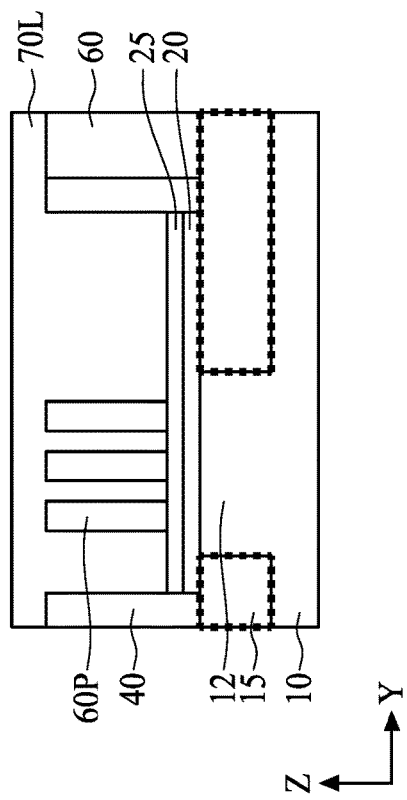
Figure 8C:
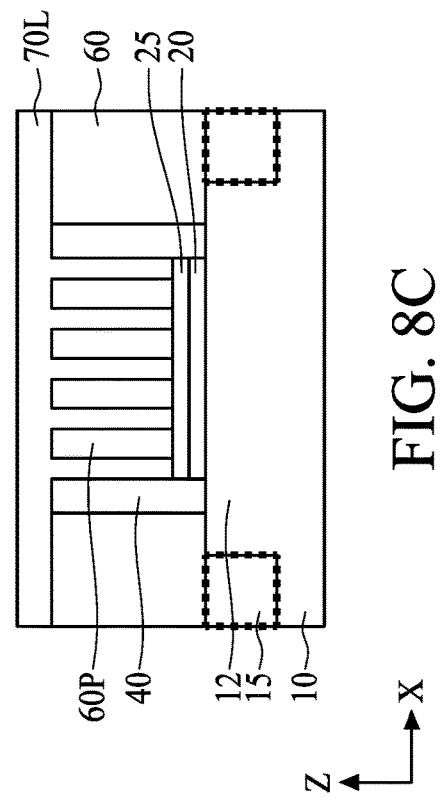
Figure 8D:
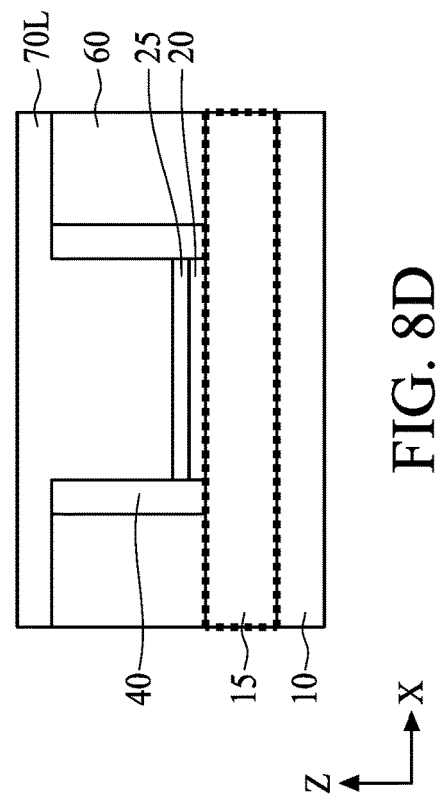
Figure 9B:
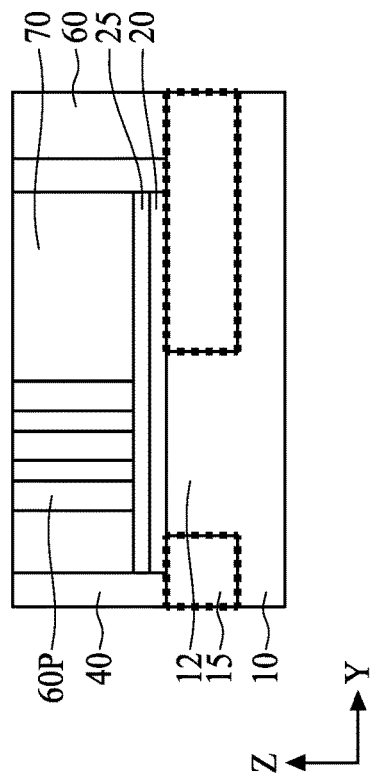
FIGS. 9A, 9B, 9C and 9D show various view of one of the sequential manufacturing process of a semiconductor device according to embodiments of the present disclosure.
Figure 9D:
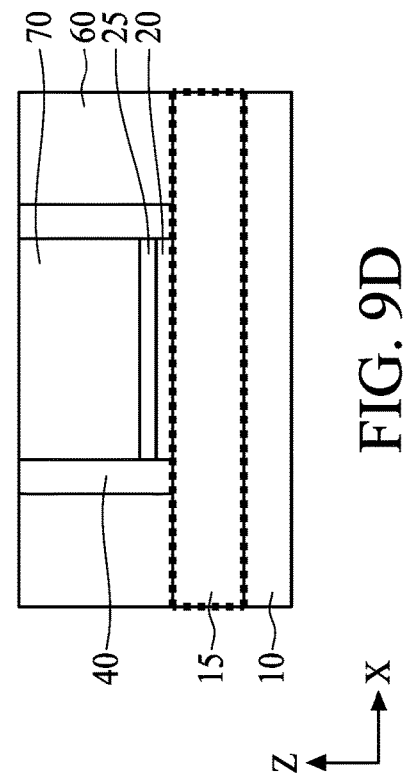
Figure 9A:
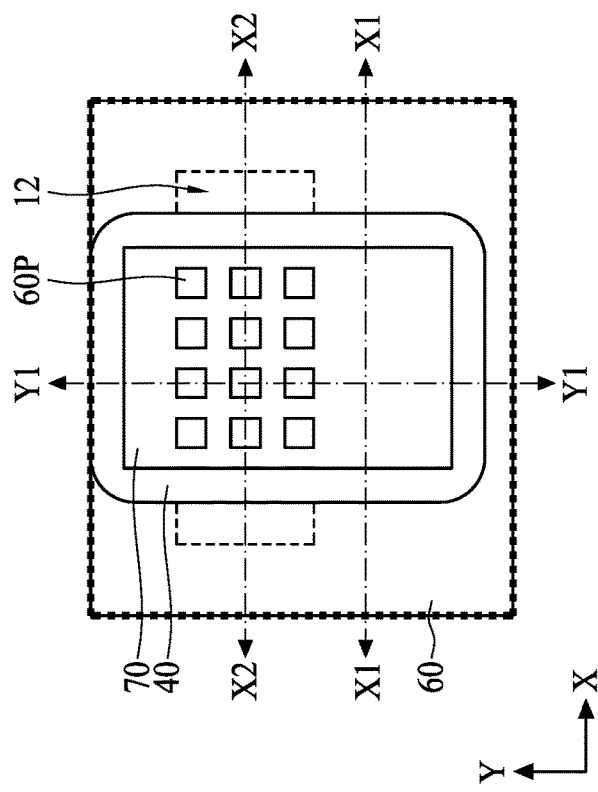
Figure 9C:
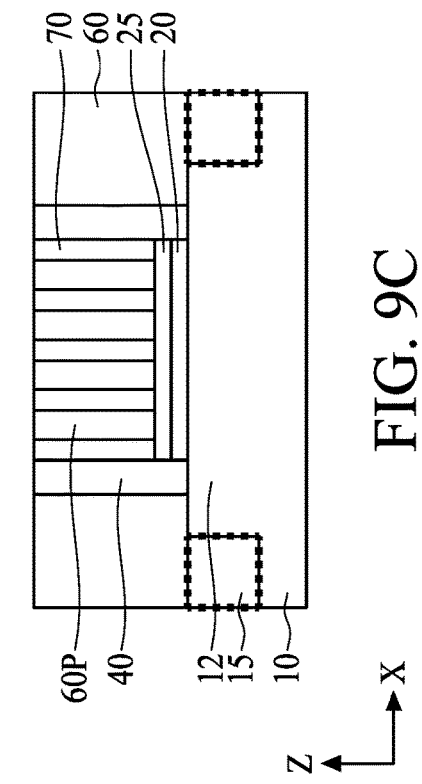
Figure 11B:
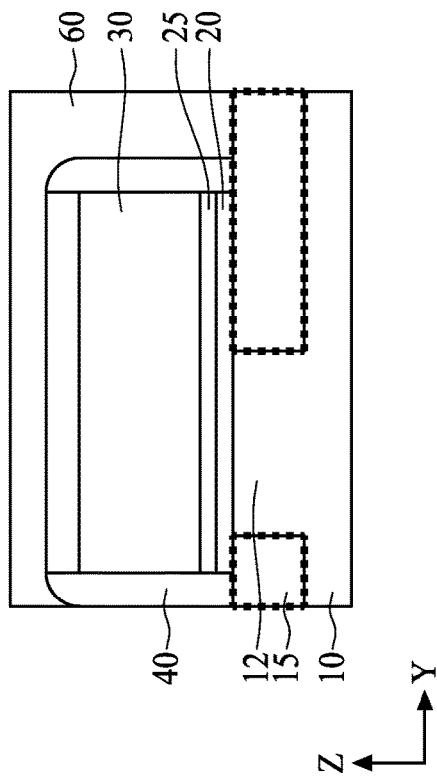
FIGS. 11A, 11B, 11C and 11D shows various view of one of the sequential manufacturing process of a semiconductor device according to an embodiment of the present disclosure.
Figure 11D:
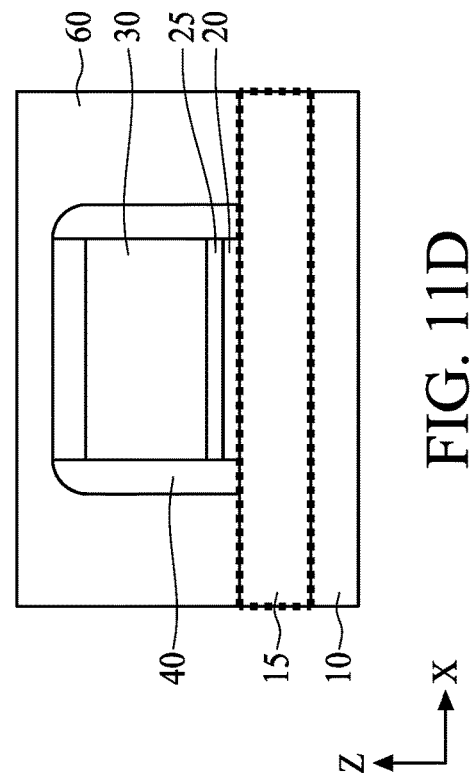
Figure 11A:
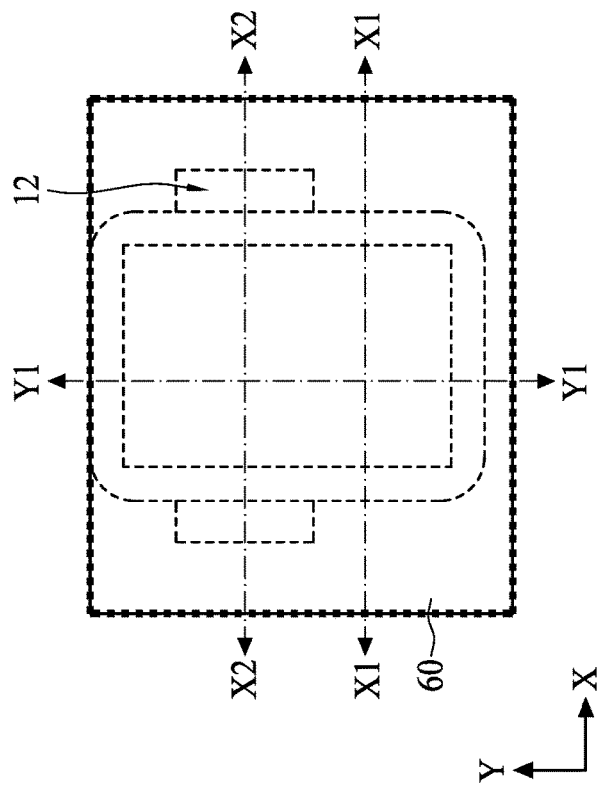
Figure 11C:
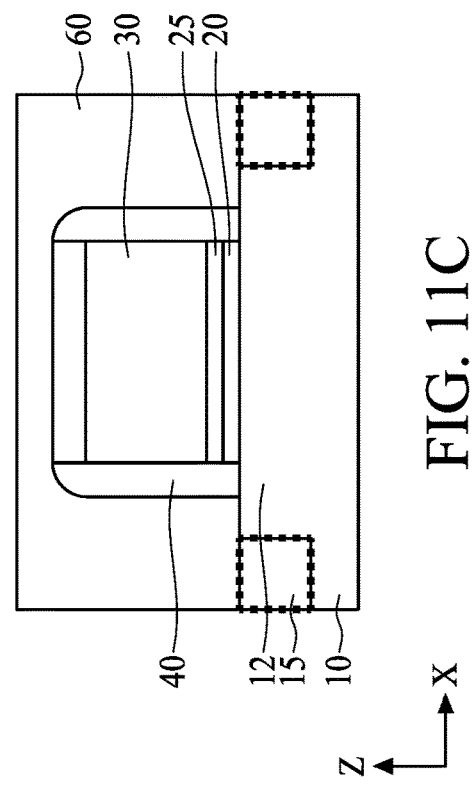
Figure 12A:
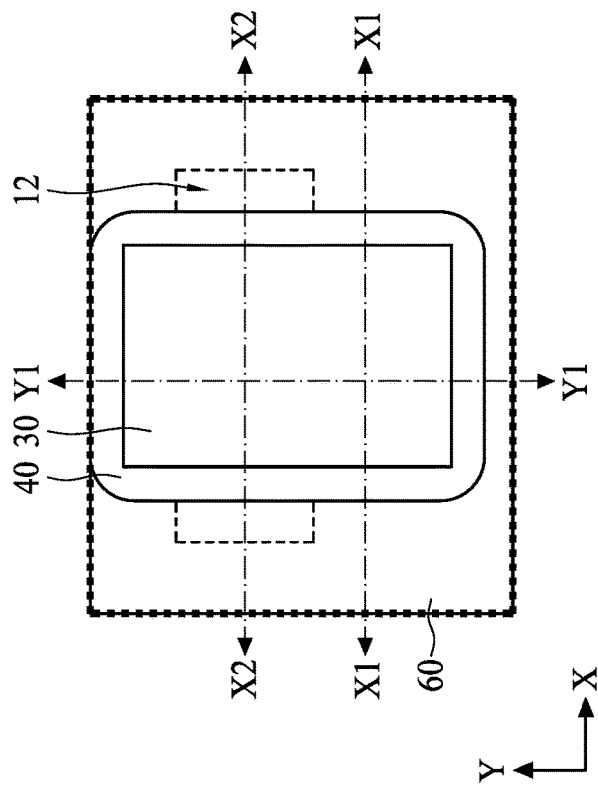
FIGS. 12A, 12B, 12C and 12D shows various view of one of the sequential manufacturing process of a semiconductor device according to an embodiment of the present disclosure.
Figure 12B:
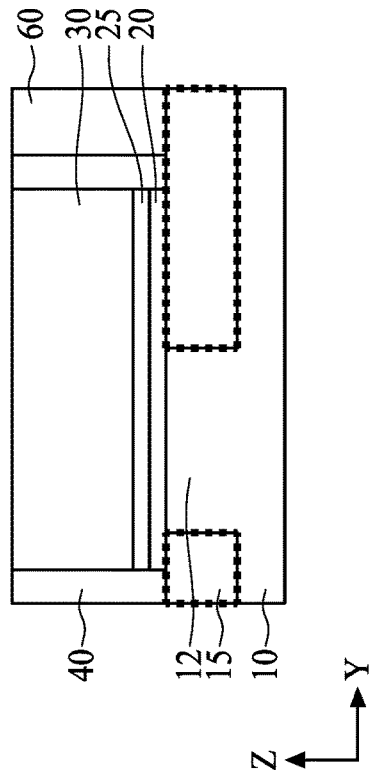
Figure 12C:
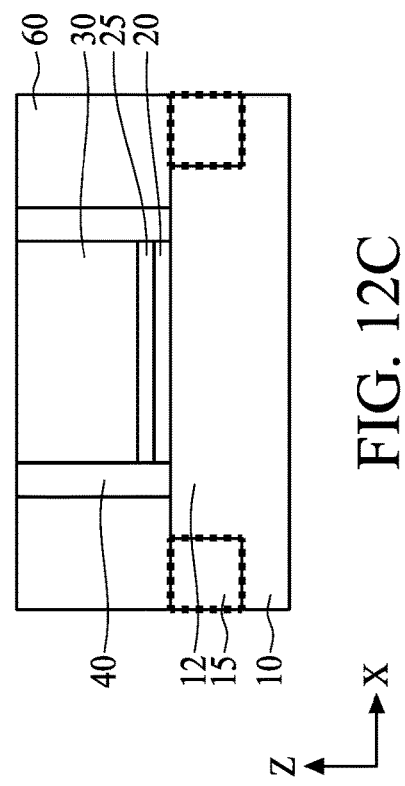
Figure 12D:
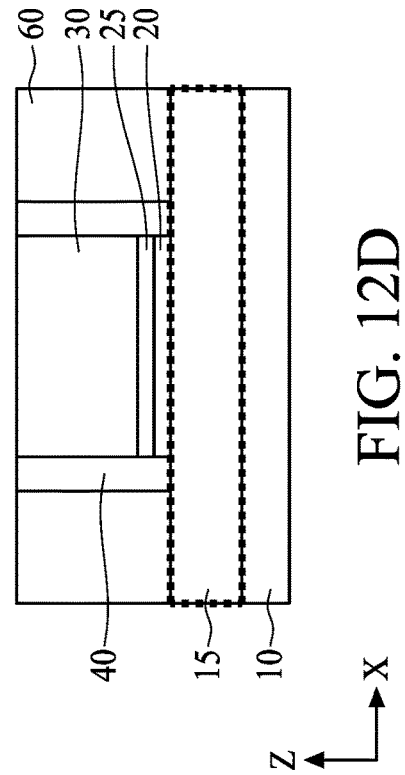
Figure 13B:
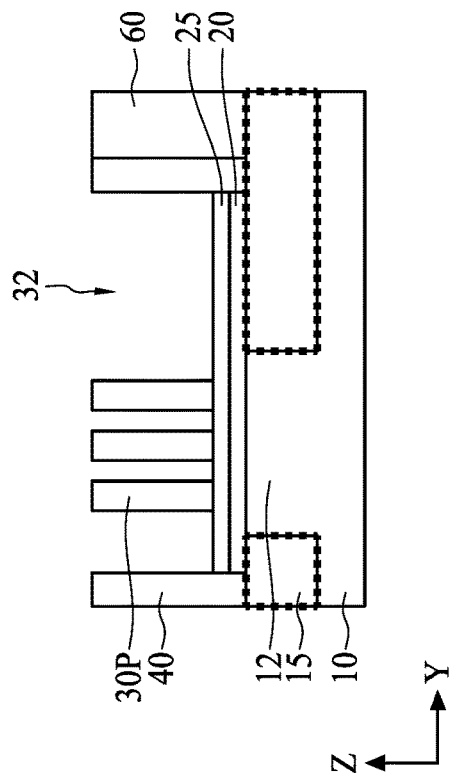
FIGS. 13A, 13B, 13C and 13D shows various view of one of the sequential manufacturing process of a semiconductor device according to an embodiment of the present disclosure.
Figure 13D:
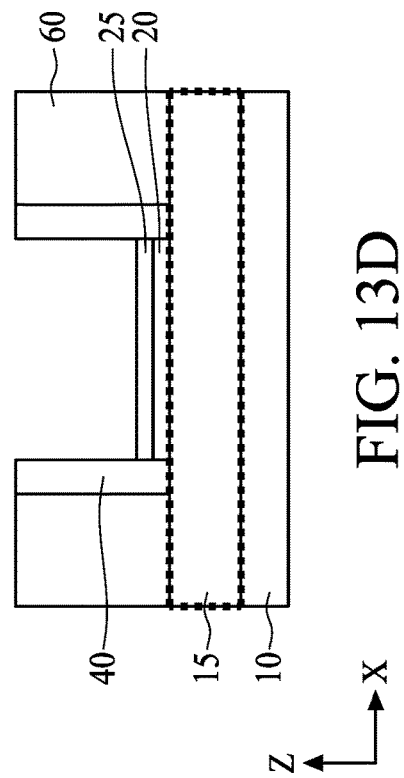
Figure 13A:
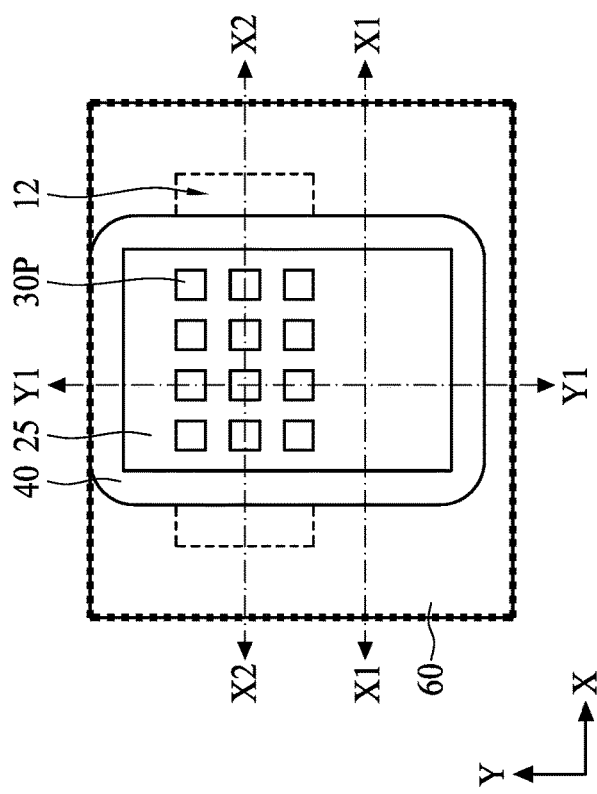
Figure 13C:
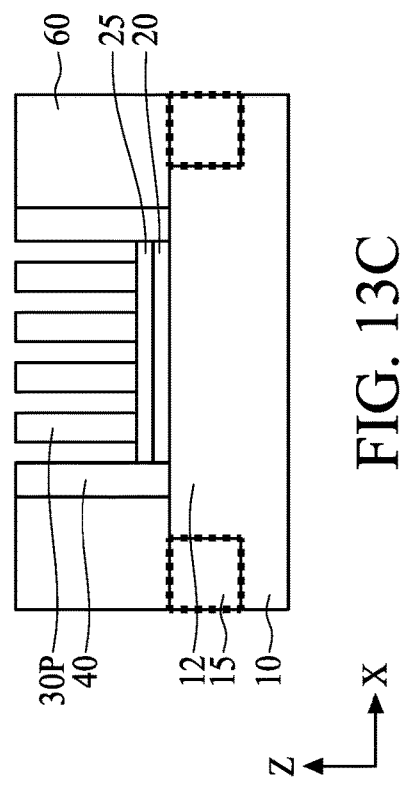
Figure 14B:
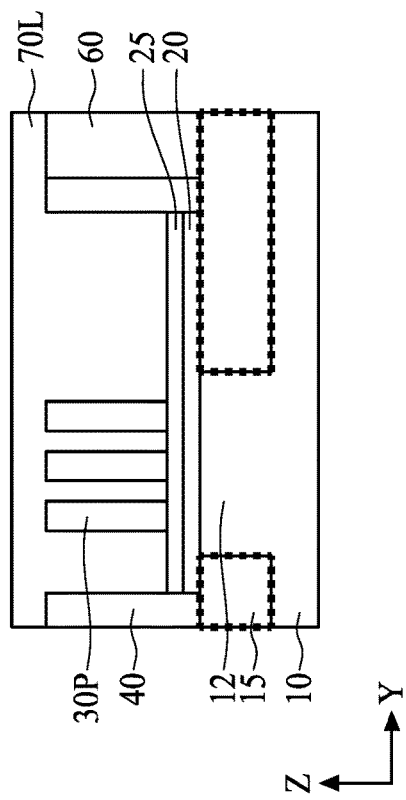
FIGS. 14A, 14B, 14C and 14D shows various view of one of the sequential manufacturing process of a semiconductor device according to an embodiment of the present disclosure.
Figure 14D:
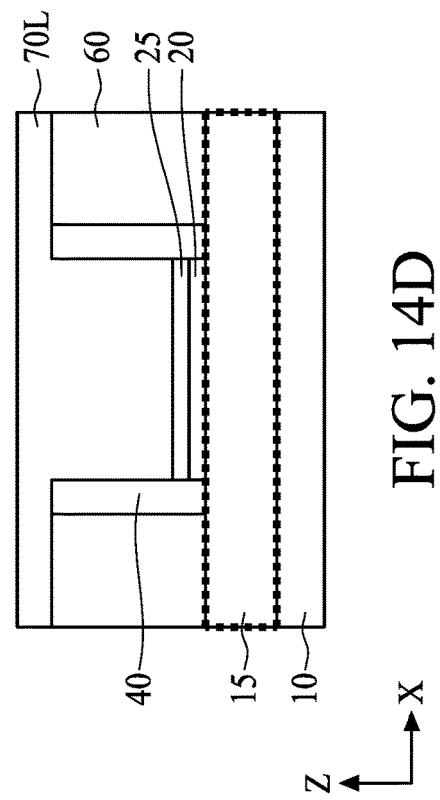
Figure 14A:
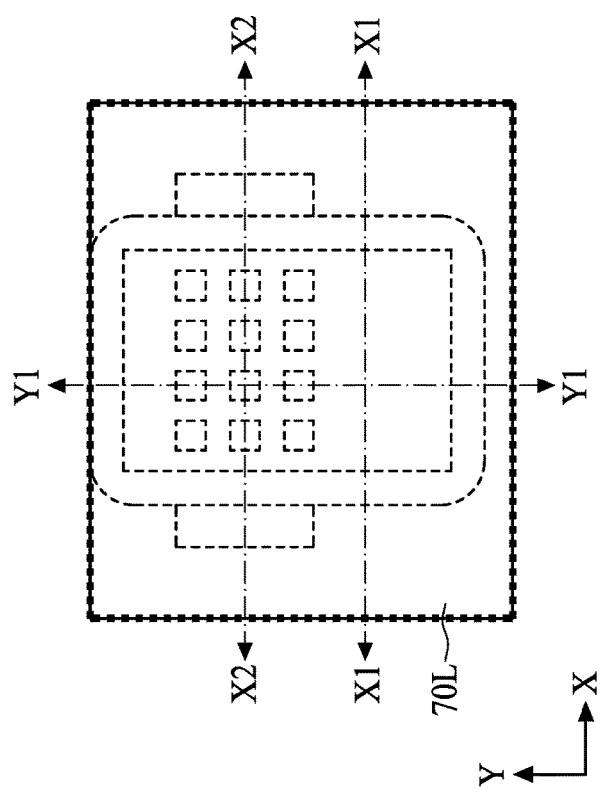
Figure 14C:
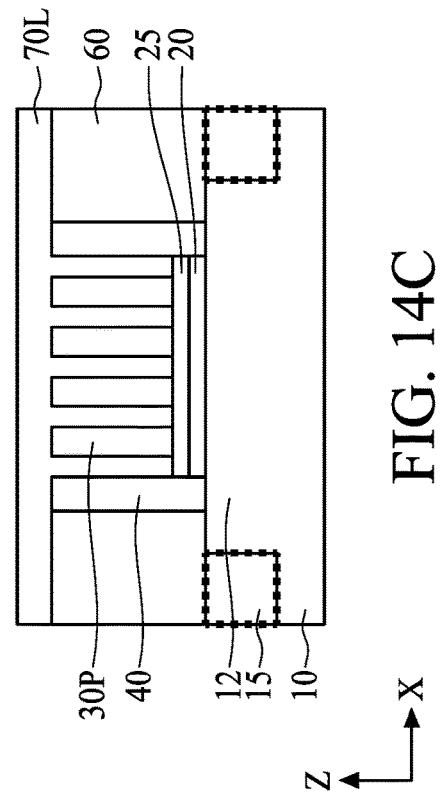
Figure 15B:
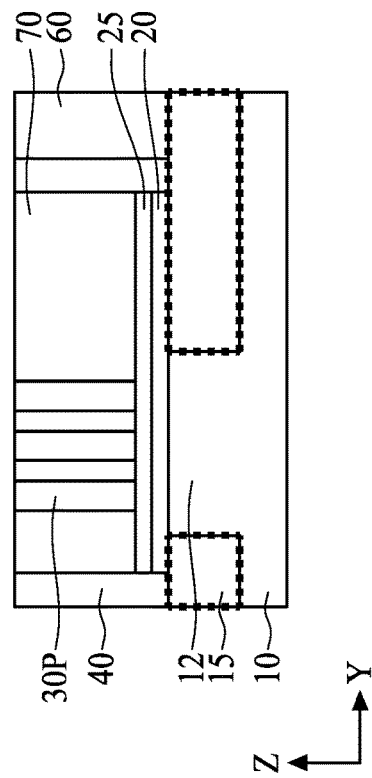
FIGS. 15A, 15B, 15C and 15D shows various view of one of the sequential manufacturing process of a semiconductor device according to an embodiment of the present disclosure.
Figure 15D:
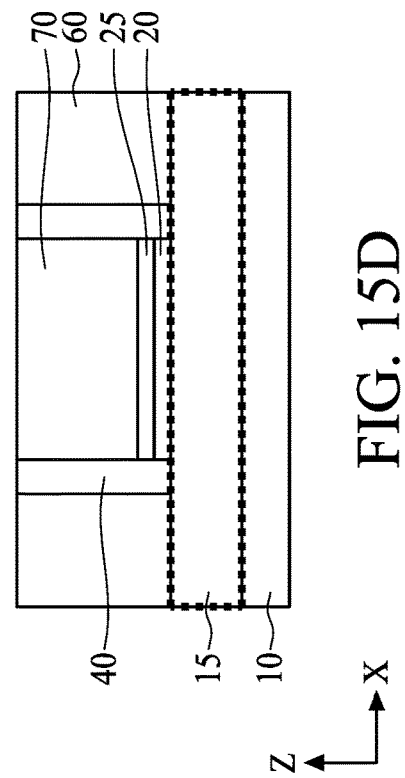
Figure 15A:
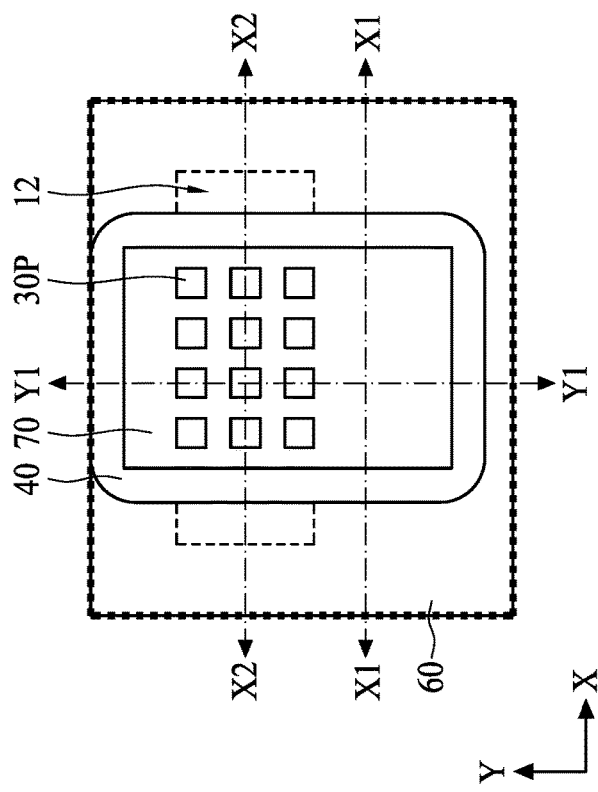
Figure 15C:
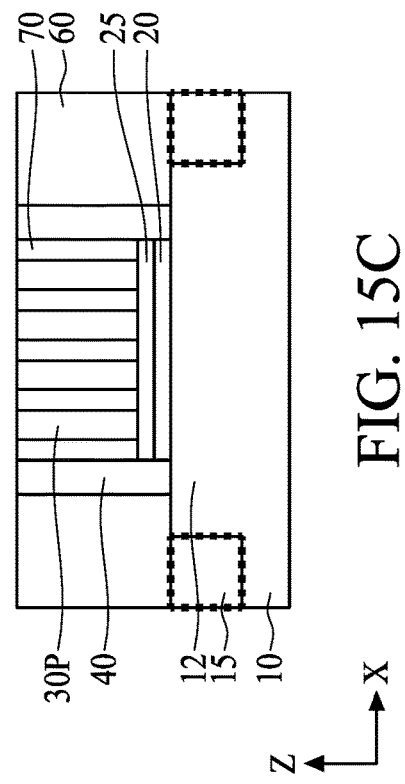
Figure 16B:
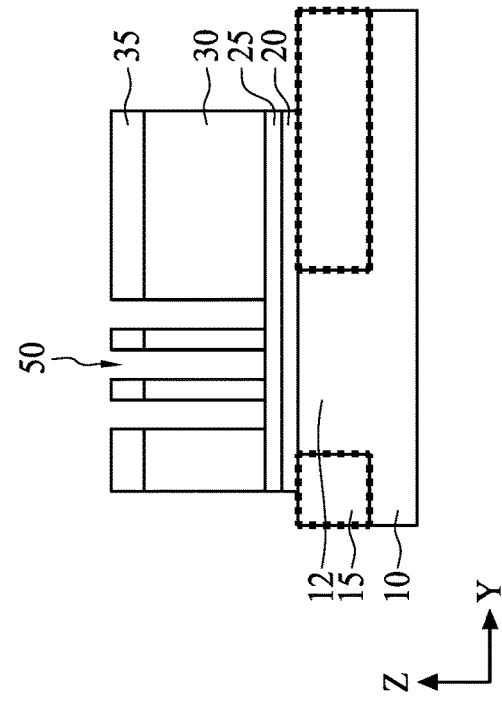
FIGS. 16A, 16B, 16C and 16D shows various view of one of the sequential manufacturing process of a semiconductor device according to an embodiment of the present disclosure.
Figure 16D:
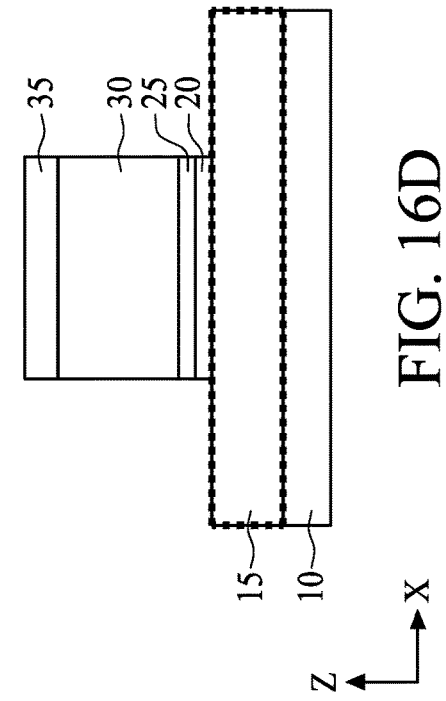
Figure 16A:
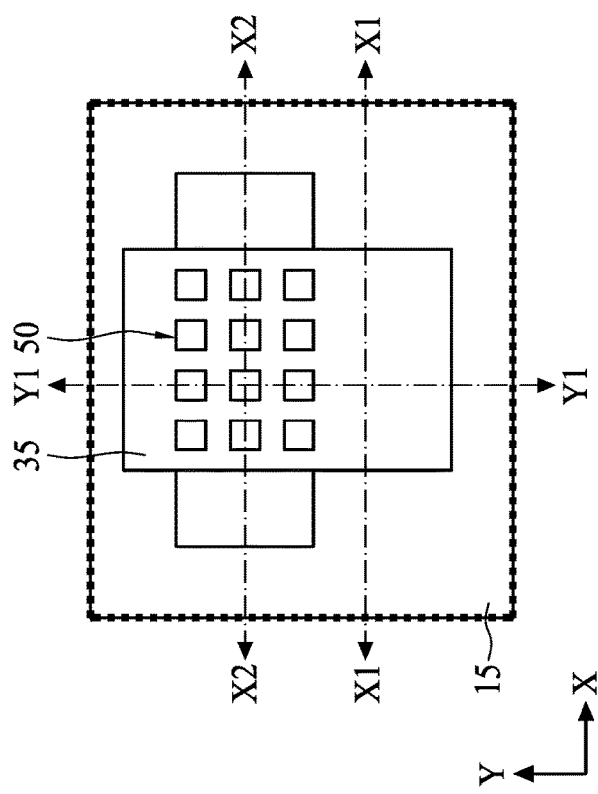
Figure 16C:
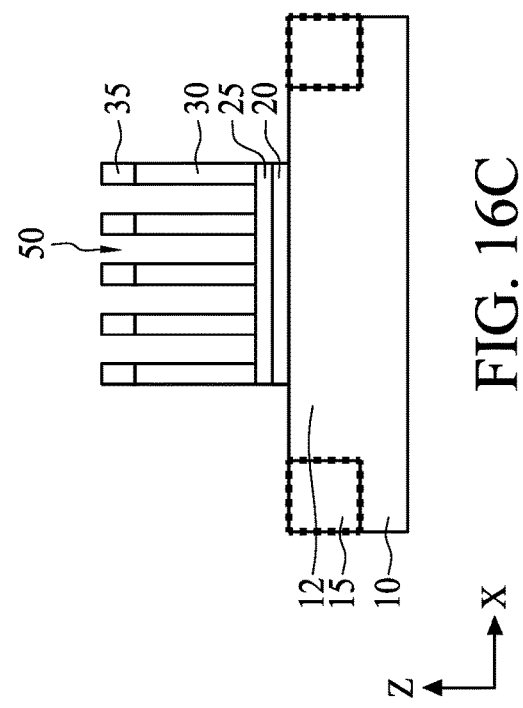
Figure 17A:
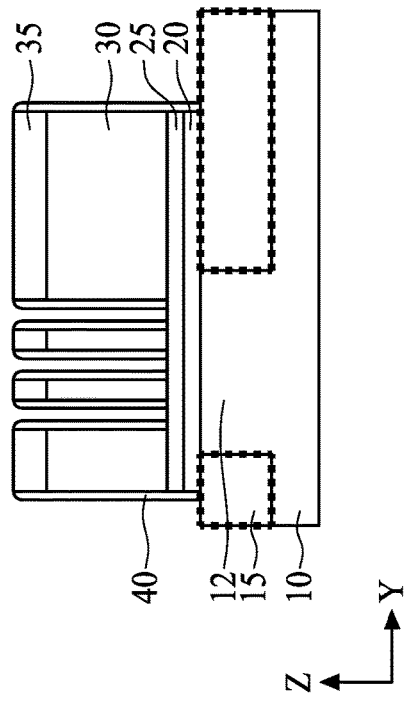
FIGS. 17A, 17B, 17C and 17D shows various view of one of the sequential manufacturing process of a semiconductor device according to an embodiment of the present disclosure.
Figure 17B:
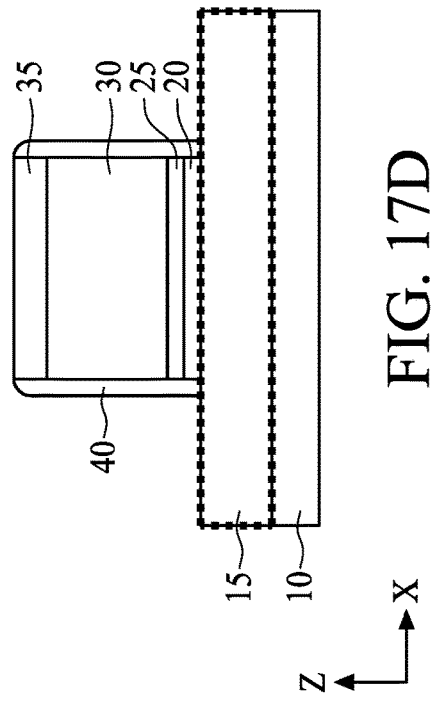
Figure 17C:
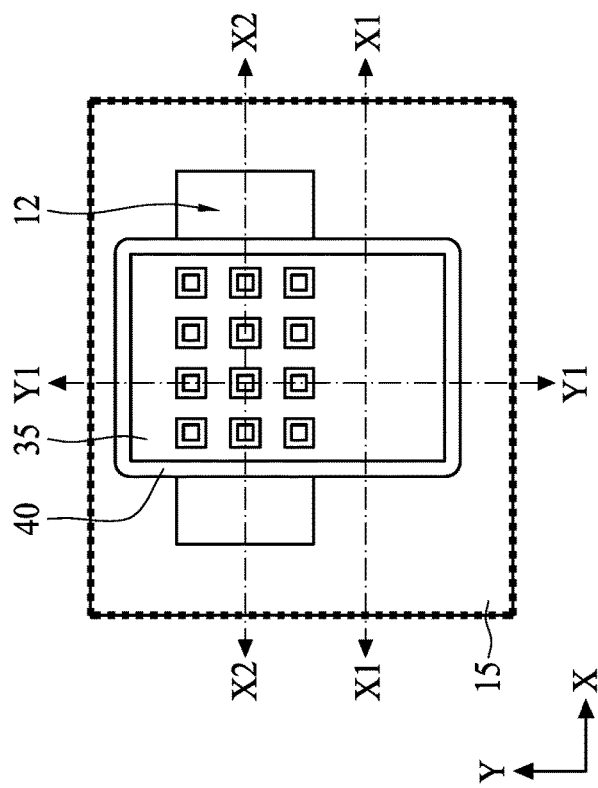
Figure 17D:
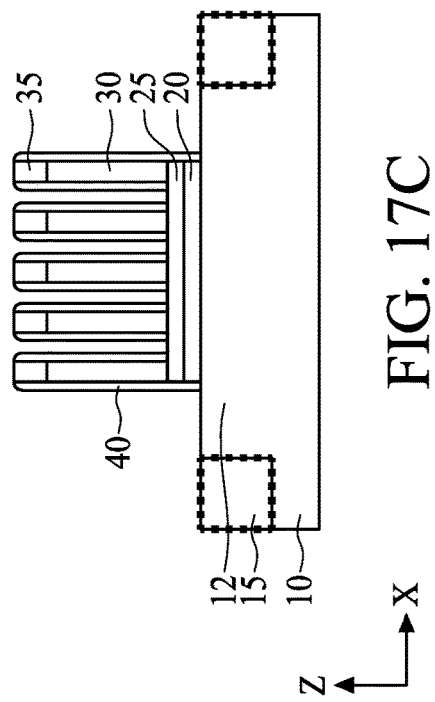

Then, one or more planarization operations are performed to remove an excess portion of the first ILD layer 60 and the hard mask layer 35 to expose the sacrificial gate electrode layer 30. In some embodiments, one or more CMP operations are performed. As shown in FIGS. 6A-6C, a plurality of pillars or walls 60P formed of the same material of the first ID layer 60 are formed in the sacrificial gate electrode layer 30. The pillars or walls 60P made of the same material as the first ILD layer 60 are disposed on the cap layer 25. When an etching stop layer is also formed, the pillars 60P include a bottom layer made of the same material as the etching stop layer (e.g., silicon nitride) and an upper layer made of the same material as the first ILD layer (e.g., silicon oxide).

Next, as shown in FIGS. 7A-7D, the sacrificial gate electrode layer 30 is removed to form a gate space 32, in which the pillars or walls 60P are disposed. When the sacrificial gate electrode layer 30 is formed by polysilicon or amorphous silicon, a wet etching using a tetramethylammonium hydroxide (TMAH) aqueous solution can be used to selectively remove the sacrificial gate electrode layer 30.

Subsequently, one or more conductive layer 70L is formed in the gate space and the first ILD layer 60 as shown in FIGS. 8A-8D. The conductive layer 70L includes one or more layers of any suitable metal material, such as aluminum, copper, titanium, tantalum, cobalt, molybdenum, tungsten, tantalum nitride, nickel silicide, cobalt silicide, TiN, WN, TiAl, TiAlN, TaCN, TaC, TaSiN, metal alloys, other suitable materials, and/or combinations thereof.

In some embodiments, one or more work function adjustment layers are formed over the cap layer 25 and a body metal layer is formed over the work function adjustment layer.

Then, one or more planarization operations are performed to remove an excess portion of the conductive layer 70L, to form a metal gate electrode 70 as shown in FIGS. 9A-9D. In some embodiments, one or more CMP operations are performed. As shown in FIGS. 9A-9D, the plurality of pillars or walls 60P function as a polishing stop structure in the CMP operation, and thus, dishing of the metal gate electrode in a large pattern, in particular a center region of the large pattern, can be suppressed. In some embodiments, the pillars or walls are made of a material having a lower etching rate in the CMP operation than the conductive layer 70L. In some embodiments, one or more parameters of the CMP operation is set so that the pillars or walls are made of a material having a lower etching rate than the conductive layer 70L.

Subsequently, a second ILD layer 75 is formed over the metal gate structure and the first ILD layer 60, a gate contact 80 is formed in the second ILD layer, a third ILD layer 85 is formed over the second ILD layer in which a wiring pattern 90 is formed, as shown in FIG. 10A. In some embodiments, the gate contact 80 is formed on an area of the metal gate electrode 70 where no pillar or wall is formed. In other words, an entirety of the bottom face of the gate contact 90 is in contact with the metal gate electrode 70. In some embodiments, the gate contact is formed above the isolation structure 15. The second and third ILD layers are made of the same or similar material as the first ILD layer and include compounds comprising Si, O, C and/or H, such as silicon oxide, SiCOH and SiOC. The gate contact 90 and the wiring pattern 90 are made of one or more conductive layers made of, for example, Co, W, Ti, Ta, Cu, Al, Ru and/or Ni and/or a nitride or an alloy thereof.

As shown in FIG. 10A, although insulating pillars or walls 60P are formed in the metal gate electrode 70, the cap layer 25 is formed over an entire upper surface of the gate dielectric layer 20 and electrically connects all segments of the metal gate electrode 70.

FIGS. 11A-15D and 10B show views of various stages of a sequential manufacturing operation of a semiconductor device according to the present disclosure. It is understood that additional operations may be provided before, during, and after the processes shown by FIGS. 11A-15D and 10B, and some of the operations described below can be replaced or eliminated for additional embodiments of the method. The order of the operations/processes may be interchangeable. In FIGS. 11A-15D, the "A" figures (FIGS. 11A, 12A, . . . ) are plan views (a layout or a top view), the "B" figures (FIGS. 11B, 12B, . . . ) are cross sectional views along Y1-Y1 line in the "A" figures, the "C" figures (FIGS. 11C, 12C, . . . ) are cross sectional views along X1-X1 line in the "A" figures, and the "D" figures (FIGS. 11D, 12D, . . . ) are cross sectional views along X2-X2 line in the "A" figures. Materials, dimensions, configurations and/or processes as explained with the foregoing embodiments may also be employed in the following embodiments, and detailed description may be omitted.

After the sacrificial gate structure and the gate sidewall spacer 40 are formed as shown in FIGS. 3A-3D, a first ILD layer 60 is formed as shown in FIGS. 11A-11D.

Then, similar to the operations explained with respect to FIGS. 6A-6D, one or more planarization operations are performed to remove an excess portion of the first ILD layer 60 and the hard mask layer 35 to expose the sacrificial gate electrode layer 30, as shown in FIGS. 12A-12D.

Next, as shown in FIGS. 13A-13D, the sacrificial gate electrode layer 30 is patterned by using a patterning operation including lithography and etching operations to form one or more pillars or walls 30P in a gate space 32. In some embodiments, an etching operation of the sacrificial gate electrode layer 30 substantially stops at the cap layer 25. In some embodiments, the pillars or walls 30P are formed only above the active (channel) region 12. In other embodiments, the pillars or walls 30P are formed above the active region 12 and above the isolation structure 15. In some embodiments, the pillars or walls 30P have a tapered shape having a top larger than a bottom.

Then, similar to the operations as explained with respect to FIGS. 8A-8D, one or more conductive layer 70L is formed in the gate space 32 and the first ILD layer 60 as shown in FIGS. 14A-14D. The conductive layer 70L includes one or more layers of any suitable metal material, such as aluminum, copper, titanium, tantalum, cobalt, molybdenum, tungsten, tantalum nitride, nickel silicide, cobalt silicide, TiN, WN, TiAl, TiAlN, TaCN, TaC, TaSiN, metal alloys, other suitable materials, and/or combinations thereof. In some embodiments, one or more work function adjustment layers are formed over the cap layer 25 and a body metal layer is formed over the work function adjustment layer.

Then, similar to the operations as explained with respect to FIGS. 9A-9D one or more planarization operations are performed to remove an excess portion of the conductive layer 70L, to form a metal gate electrode 70 as shown in FIGS. 15A-15D. In some embodiments, one or more CMP operations are performed. As shown in FIGS. 15A-15D, the plurality of pillars or walls 30P made of polysilicon or amorphous silicon function as a polishing stop structure in the CMP operation, and thus, dishing of the metal gate electrode in a large pattern, in particular a center region of the large pattern, can be suppressed. In some embodiments, the pillars or walls are made of a material having a lower etching rate in the CMP operation than the conductive layer 70L. In some embodiments, one or more parameters of the CMP operation is set so that the pillars or walls are made of a material has a lower etching rate than the conductive layer 70L.

Subsequently, a second ILD layer 75 is formed over the metal gate structure and the first ILD layer 60, a gate contact 80 is formed in the second ILD layer, a third ILD layer 85 is formed over the second ILD layer in which a wiring pattern 90 is formed, as shown in FIG. 10B, similar to the operations as explained with respect to FIG. 10A.

FIGS. 16A-20D and 10C show views of various stages of a sequential manufacturing operation of a semiconductor device according to the present disclosure. It is understood that additional operations may be provided before, during, and after the processes shown by FIGS. 16A-20D and 10C, and some of the operations described below can be replaced or eliminated for additional embodiments of the method. The order of the operations/processes may be interchangeable. In FIGS. 16A-20D, the "A" figures (FIGS. 16A, 17A, . . . ) are plan views (a layout or a top view), the "B" figures (FIGS. 16B, 17B, . . . ) are cross sectional views along Y1-Y1 line in the "A" figures, the "C" figures (FIGS. 16C, 17C, . . . ) are cross sectional views along X1-X1 line in the "A" figures, and the "D" figures (FIGS. 16D, 17D, . . . ) are cross sectional views along X2-X2 line in the "A" figures. Materials, dimensions, configurations and/or processes as explained with the foregoing embodiments may also be employed in the following embodiments, and detailed description may be omitted.

After the sacrificial gate structure is formed as shown in FIGS. 2A-2D, the hard mask layer 35 and the sacrificial gate electrode layer 30 are patterned by using a patterning operation including lithography and etching operations to form one or more openings 50, as shown in FIGS. 16A-16D. In some embodiments, an etching operation of the sacrificial gate electrode layer 30 substantially stops at the cap layer 25. In some embodiments, the openings 50 are formed only above the active (channel) region 12. In other embodiments, the openings 50 are formed above the active region 12 and above the isolation structure 15. In some embodiments, the openings 50 have a tapered shape having a top larger than a bottom.

Next, similar to the operations as explained with respect to FIGS. 3A-3D, a gate sidewall spacer 40 is formed on sidewalls of the sacrificial gate structure and the openings 50, as shown in FIGS. 17A-17D. One or more insulating material layers for the gate sidewall spacer 40 are formed over the sacrificial gate structure. The insulating material layer is deposited in a conformal manner so that it is formed to have substantially equal thicknesses on vertical surfaces, such as the sidewalls, horizontal surfaces, and the top of the sacrificial gate structure and the openings 50, respectively. Next, horizontal portions of the insulating material layer are removed by anisotropic etching, thereby forming the gate sidewall spacer 40 as shown in FIGS. 17A-17D. In some embodiments, the gate sidewall spacer 40 includes two to four layers of different insulating materials.

Figure 18B:
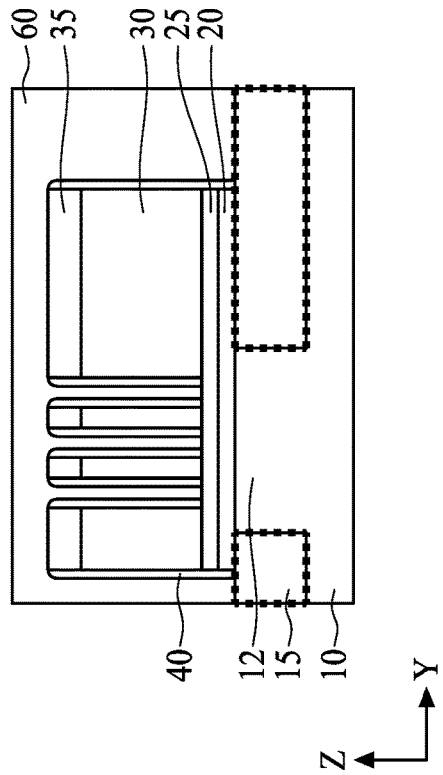
FIGS. 18A, 18B, 18C and 18D shows various view of one of the sequential manufacturing process of a semiconductor device according to an embodiment of the present disclosure.
Figure 18D:
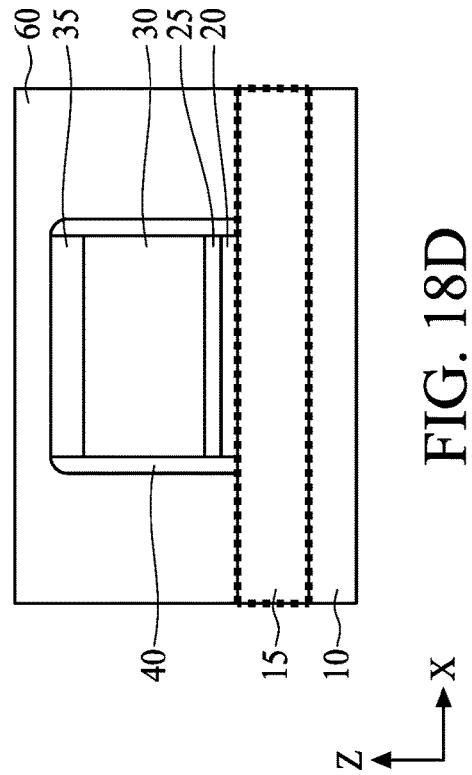
Figure 18A:
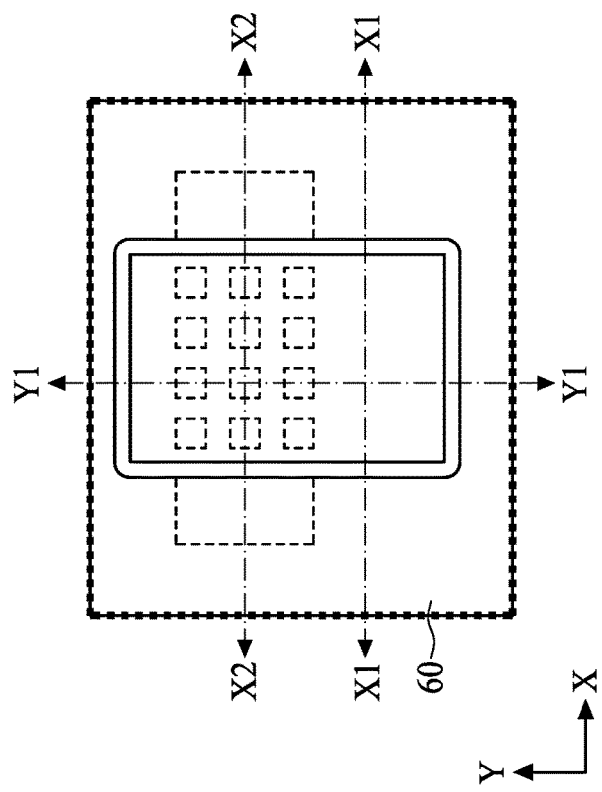
Figure 18C:
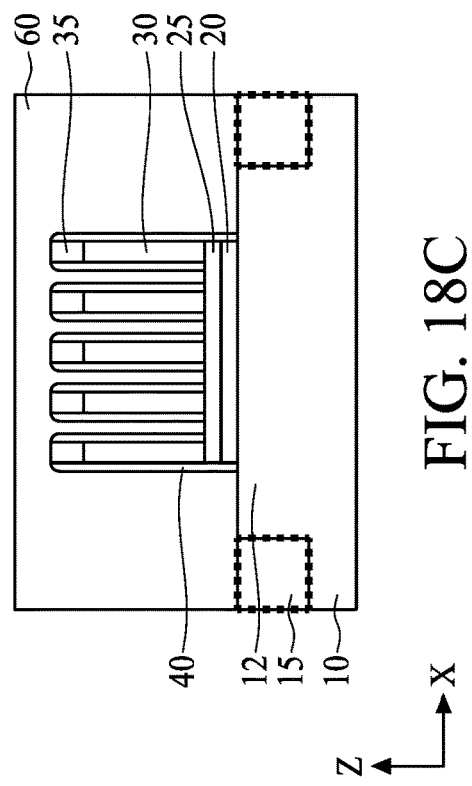
Figure 19B:
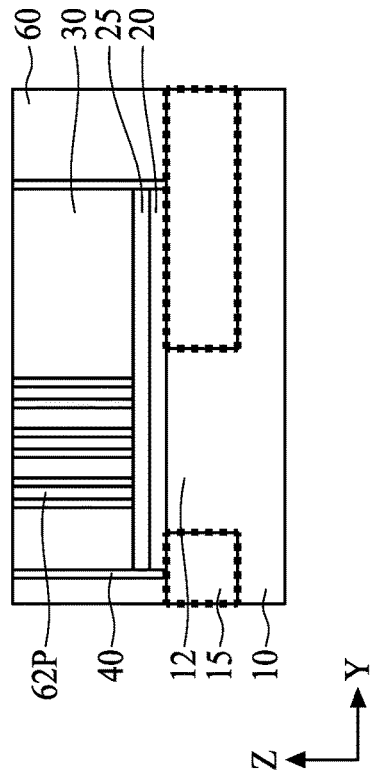
FIGS. 19A, 19B, 19C and 19D shows various view of one of the sequential manufacturing process of a semiconductor device according to an embodiment of the present disclosure.
Figure 19D:
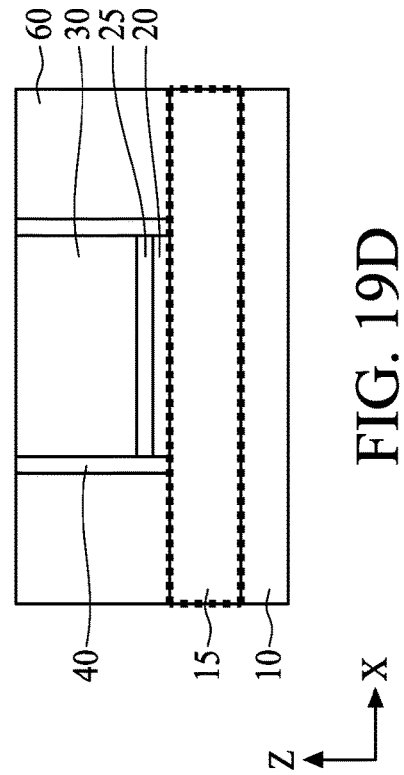
Figure 19A:
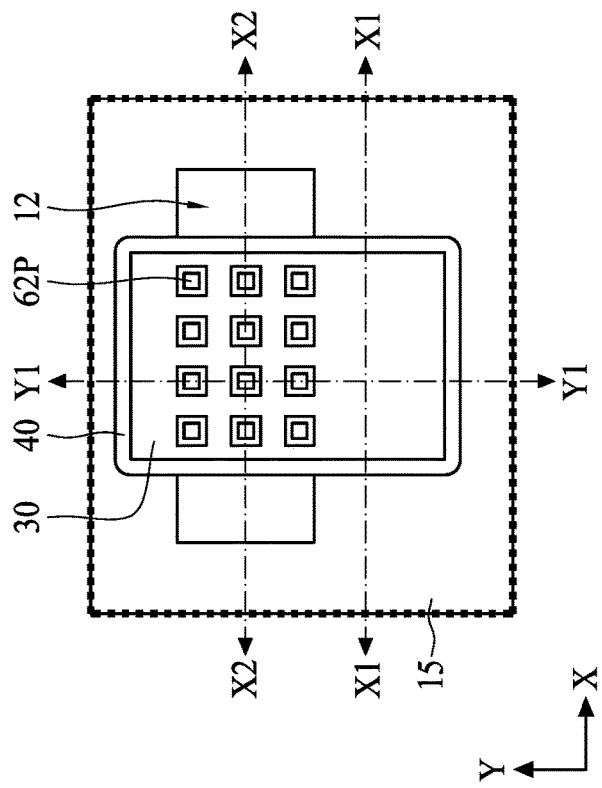
Figure 19C:
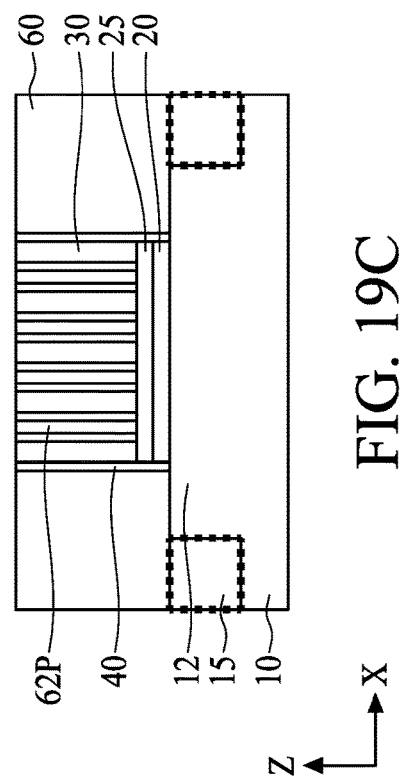
Figure 20B:
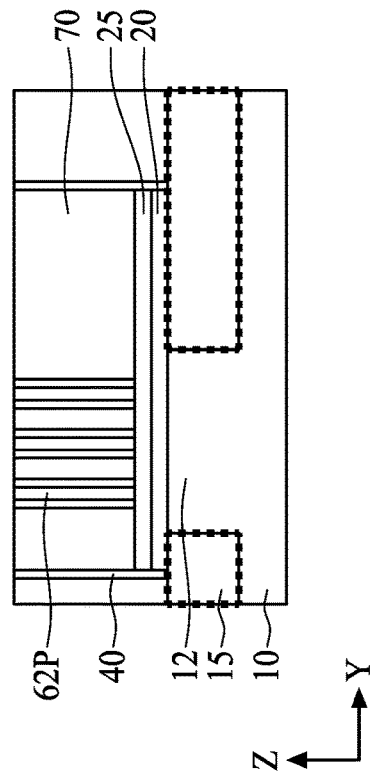
FIGS. 20A, 20B, 20C and 20D shows various view of one of the sequential manufacturing process of a semiconductor device according to an embodiment of the present disclosure.
Figure 20D:
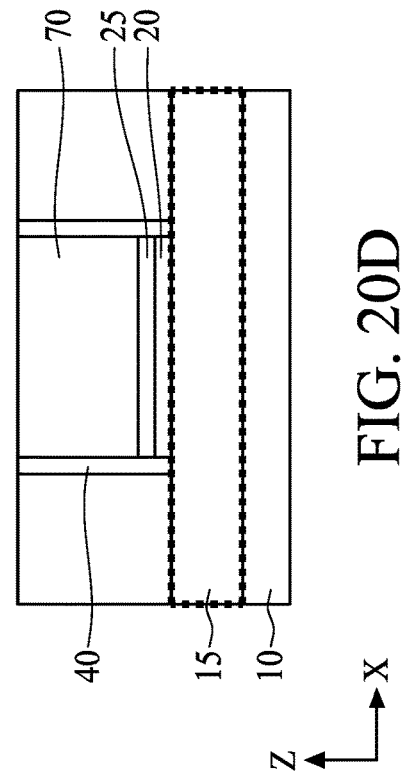
Figure 20A:
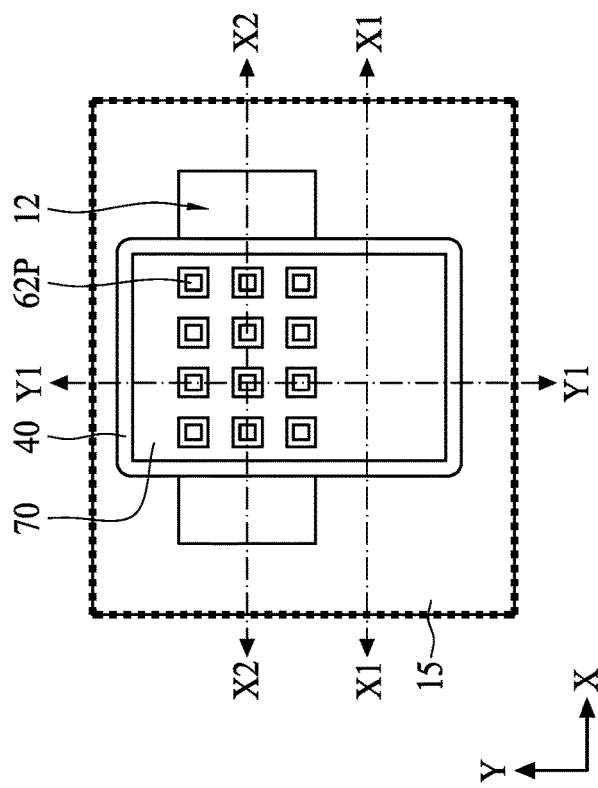
Figure 20C:
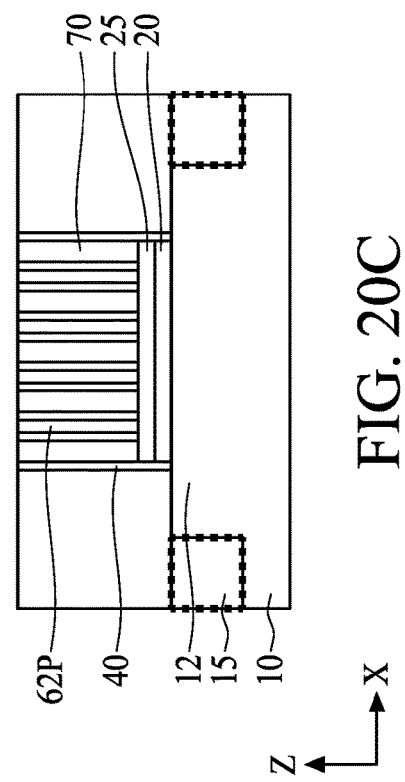

Next, similar to the operation as explained with respect to FIGS. 5A-5D, a first ILD layer 60 is formed over the sacrificial gate structure and substrate 10 and in the openings 50 by CVD or other suitable methods. The first ILD layer 60 is one or more layers of insulating material. In one embodiment, an etching stop layer made of silicon nitride is formed by CVD before forming the first ILD layer 60. The materials for the ILD layer 60 include compounds comprising Si, O, C and/or H, such as silicon oxide, SiCOH and SiOC. As shown in FIGS. 18A-18C, the first ILD layer 60 (and the etching stop layer) fully fills the openings 50.

Then, similar to the operations explained with respect to FIGS. 6A-6D, one or more planarization operations are performed to remove an excess portion of the first ILD layer 60 and the hard mask layer 35 to expose the sacrificial gate electrode layer 30, as shown in FIGS. 19A-19D. As shown in FIGS. 19A-19D, one or more pillars or walls 62P formed of the gate sidewall spacers 40 and the first ILD layer 60 filled in the openings 50 are formed in the sacrificial gate electrode layer 30.

Then, similar to the operations as explained with respect to FIGS. 6A-6D to 9A-9D, one or more planarization operations are performed to remove an excess portion of the first ILD layer 60 and the hard mask layer 35 to expose the sacrificial gate electrode layer 30 and to form a plurality of pillars or walls 62P. Next, the sacrificial gate electrode layer 30 is removed to form a gate space, in which the pillars or walls 62P are disposed. Subsequently, one or more conductive layer is formed in the gate space and the first ILD layer 60 and then one or more planarization operations are performed to remove an excess portion of the conductive layer, to form a metal gate electrode 70 as shown in FIGS. 20A-20D. As shown in FIGS. 20A-20D, the plurality of pillars or walls 62P functions as a polishing stop structure in the CMP operation, and thus, dishing of the metal gate electrode in a large pattern, in particular a center region of the large pattern, can be suppressed.

Subsequently, a second ILD layer 75 is formed over the metal gate structure and the first ILD layer 60, a gate contact 80 is formed in the second ILD layer, a third ILD layer 85 is formed over the second ILD layer in which a wiring pattern 90 is formed, as shown in FIG. 10C, similar to FIG. 10A. As shown in FIG. 10C, although insulating pillars or walls 62P are formed in the metal gate electrode 70, the cap layer 25 is formed over an entire upper surface of the gate dielectric layer 20 and electrically connects all segments of the metal gate electrode 70.

FIGS. 21 and 22A-29D show views of various stages of a sequential manufacturing operation of a semiconductor device according to the present disclosure. It is understood that additional operations may be provided before, during, and after the processes shown by FIGS. 22A-29D, and some of the operations described below can be replaced or eliminated for additional embodiments of the method. The order of the operations/processes may be interchangeable. In FIGS. 22A-29D, the "A" figures (FIGS. 22A, 23A, . . . ) are cross sectional views of a short channel NFET (n-type FET) shown in FIG. 21, the "B" figures (FIGS. 22B, 23B, . . . ) are cross sectional views of a short channel PFET (p-type FET) shown in FIG. 21, the "C" figures (FIGS. 22C, 23C, . . . ) are cross sectional views of a long channel NFET shown in FIG. 21, and the "D" figures (FIGS. 22D, 23D, . . . ) are cross sectional views of a long channel PFET of FIG. 21. Materials, dimensions, configurations and/or processes as explained with the foregoing embodiments may also be employed in the following embodiments, and detailed description may be omitted.

Figure 21:
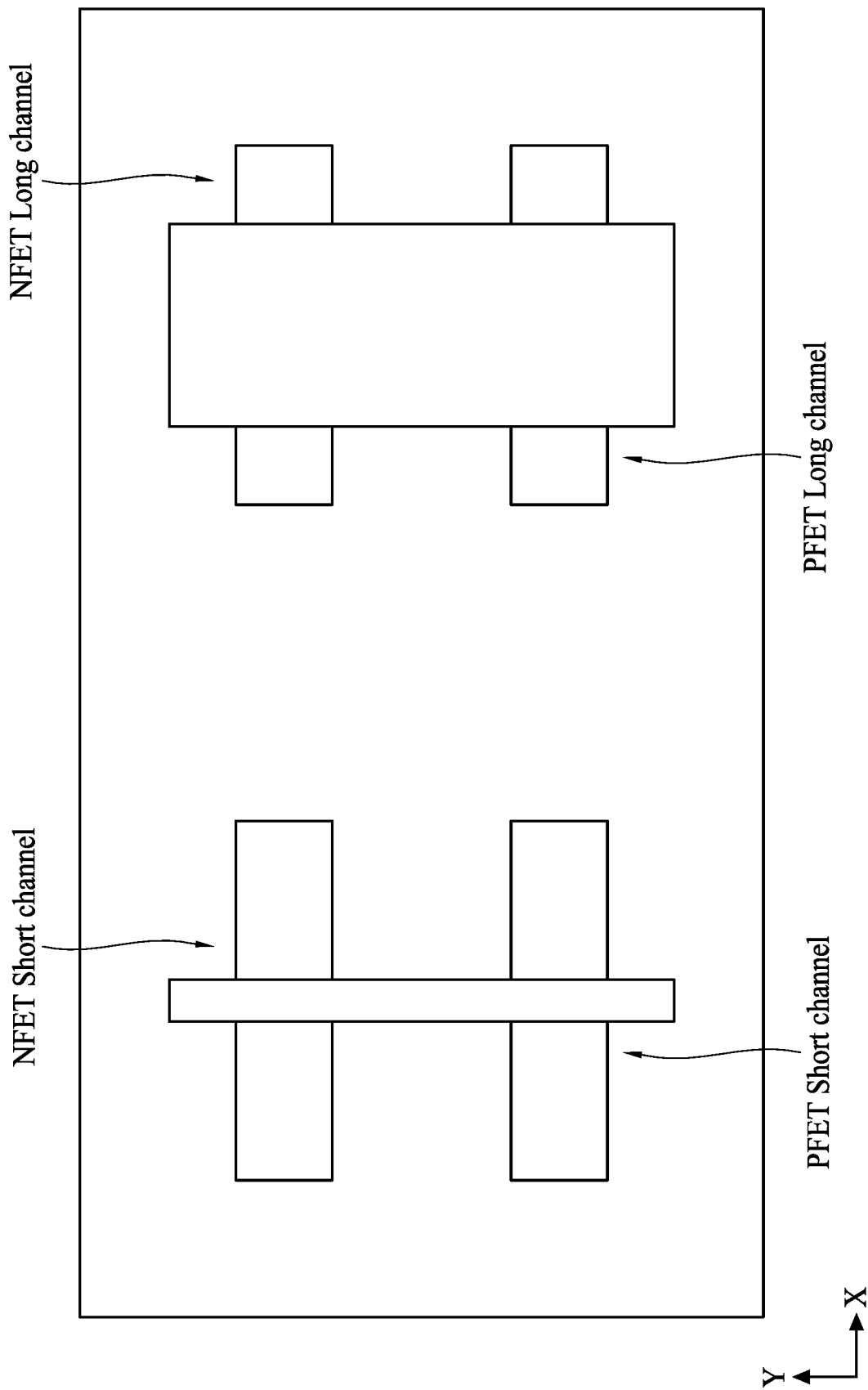
FIG. 21 shows a plan view of a semiconductor device according to an embodiment of the present disclosure.
Figure 23B:
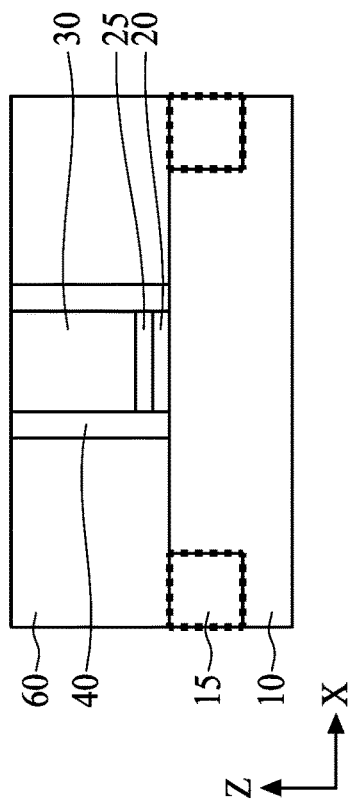
FIGS. 23A, 23B, 23C and 23D shows various view of one of the sequential manufacturing process of a semiconductor device according to an embodiment of the present disclosure.
Figure 23D:
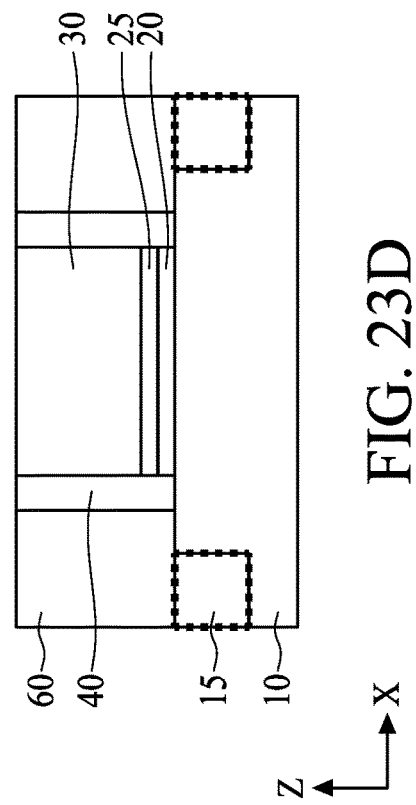
Figure 23A:
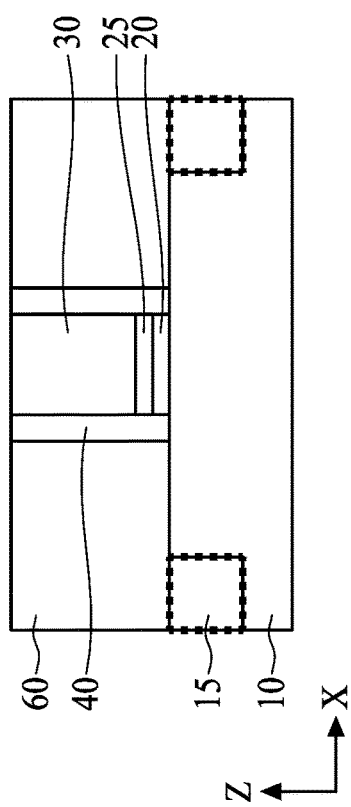
Figure 23C:
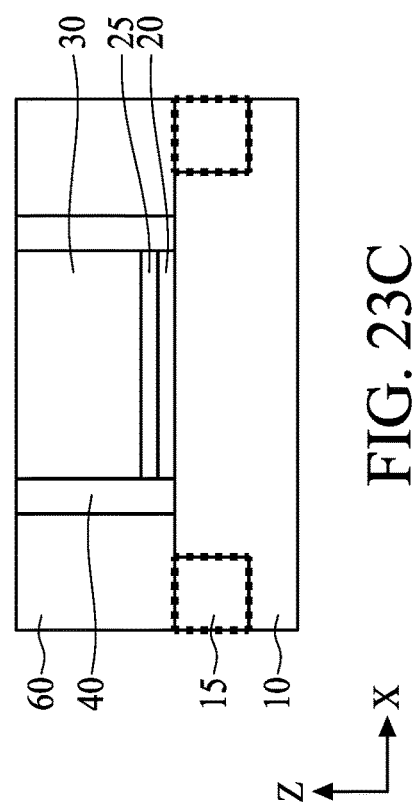

In some embodiments, as shown in FIG. 21, a semiconductor device include a CMOS device having a common gate electrode for an NFET and a PFET. In some embodiments, separate gate electrodes are used. In some embodiments, the semiconductor device includes short channel FETs and long channel FETs. In some embodiments, the gate electrodes of the long channel FETs have an area in plan view equal to or more than about 3.0 $\mu m^2$. In some embodiments, the gate length of the long channel FETs is equal to or more than about 0.5 µm and is equal to or more than about 1.0 µm in other embodiments. The short channel FETs have a shorter gate length than the long channel FETs. FIG. 21 illustrate a short channel NFET, a short channel PFET, a long channel NFET and a long channel PFET as one embodiment.

FIGS. 22A-22D show cross sectional views after the gate sidewall spacer 40 is formed on sidewalls of the sacrificial gate structure, as explained with respect to FIGS. 1A-3D. Then, as explained with respect to FIGS. 11A-12D, a first ILD layer 60 is formed and then is planarized to expose the sacrificial gate electrode layer 30, as shown in FIGS. 23A-23D.

Figure 24A:
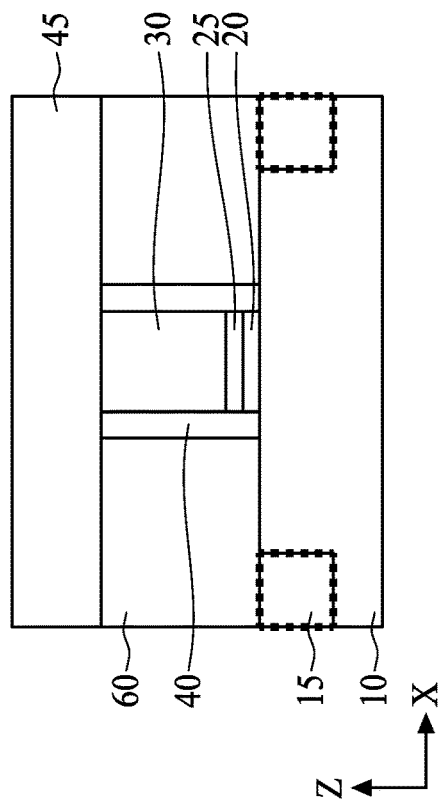
FIGS. 24A, 24B, 24C and 24D shows various view of one of the sequential manufacturing process of a semiconductor device according to an embodiment of the present disclosure.
Figure 24B:
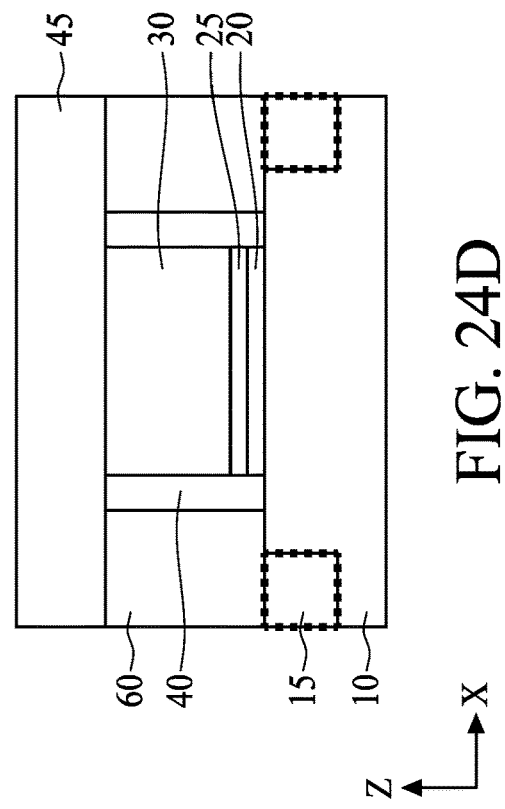
Figure 24C:
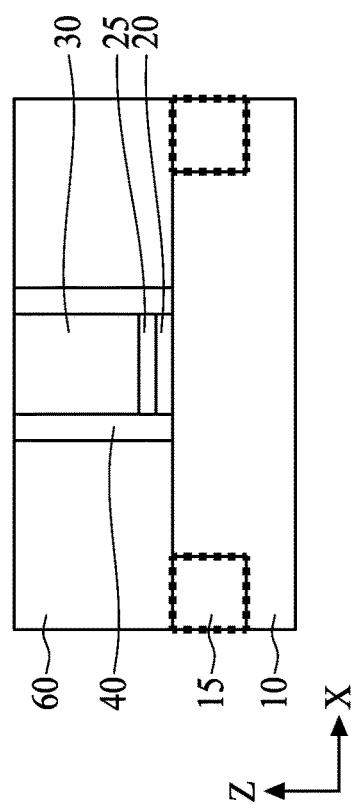
Figure 24D:
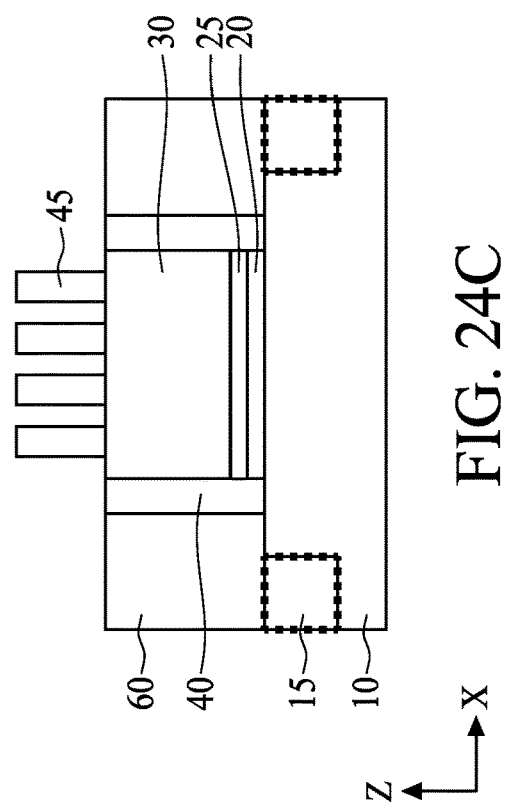

Next, as shown in FIGS. 24A-24D, a mask pattern 45 is formed. In some embodiments, the mask pattern 45 is a photo resist pattern. In some embodiments, as shown in FIGS. 24B and 24D, the mask pattern 45 fully covers (protects) the sacrificial gate electrode layer 30 for the PFETs. In some embodiments, the mask pattern 45 includes a pattern for pillars/walls formed over the sacrificial gate electrode layer 30 for the long channel NFET as shown in FIG. 24C. In some embodiments, no pattern is formed over the sacrificial gate electrode layer 30 for the short channel NFET as shown in FIG. 24A.

Figure 25A:
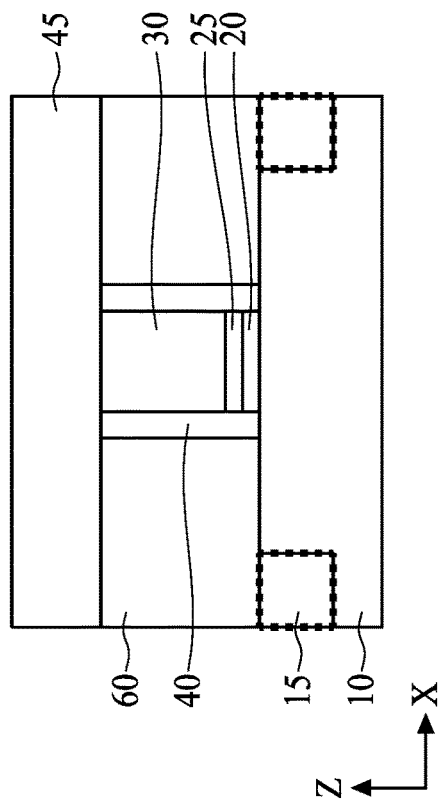
FIGS. 25A, 25B, 25C and 25D shows various view of one of the sequential manufacturing process of a semiconductor device according to an embodiment of the present disclosure.
Figure 25B:
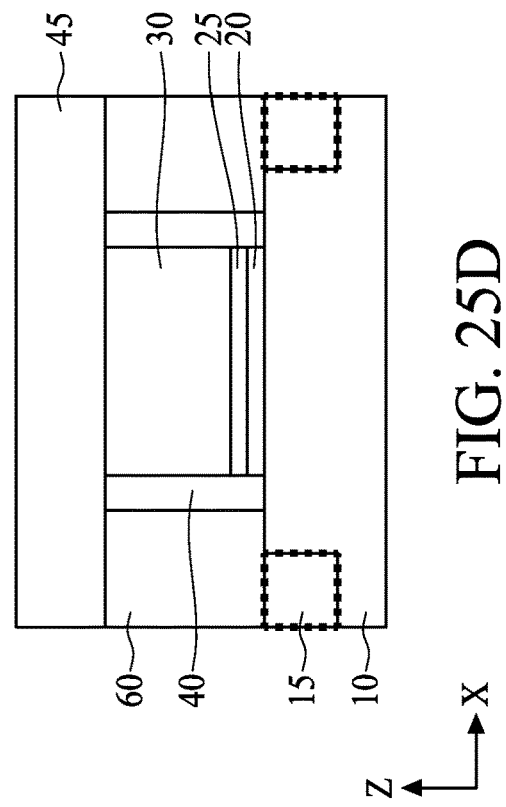
Figure 25C:
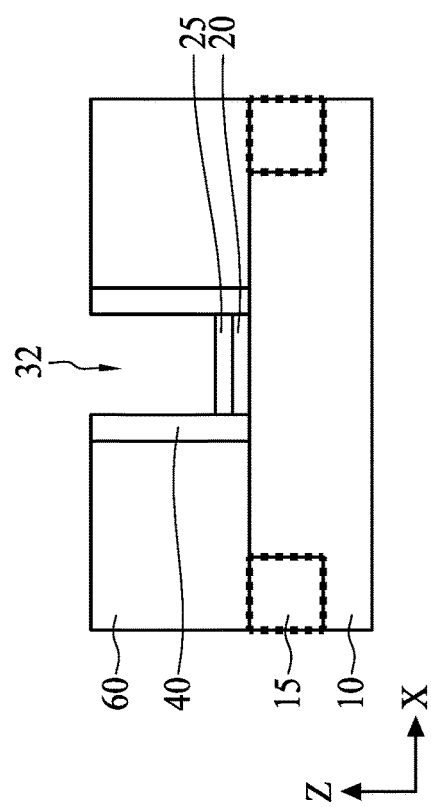
Figure 25D:
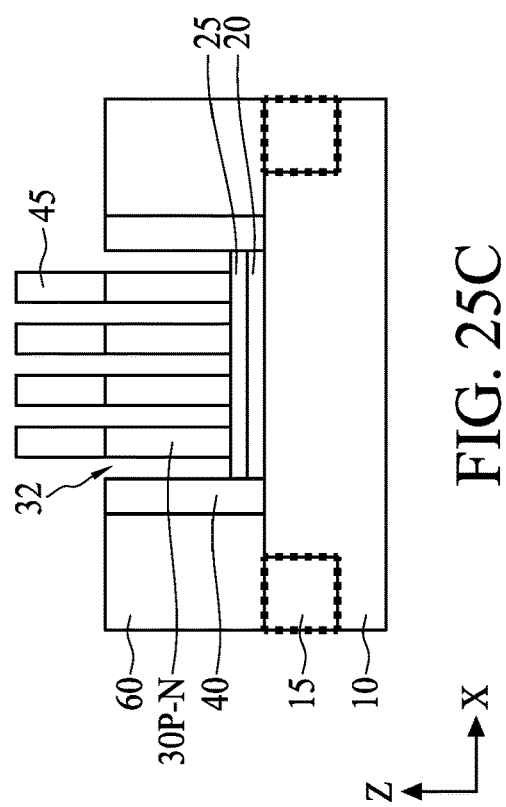

Then, the sacrificial gate electrode layer 30 for the NFETs is etched by using the mask pattern 45 as an etching mask. As shown in FIG. 25C, one or more pillars or walls 30P-N are formed in the gate space 32 for the long channel NFET, and as shown in FIG. 25A, the sacrificial gate electrode layer 30 is fully removed for the short channel NFET.

Figure 26B:
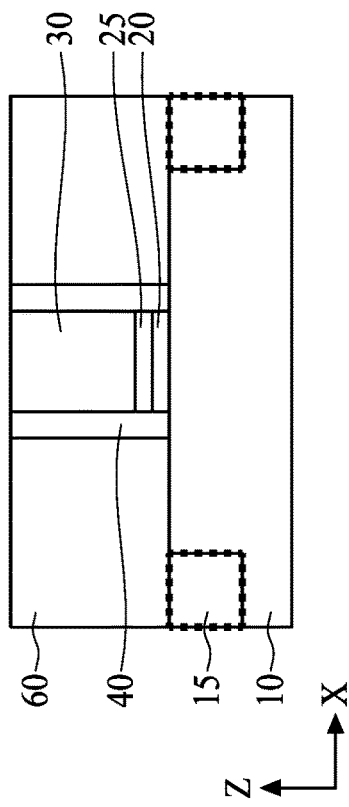
FIGS. 26A, 26B, 26C and 26D shows various view of one of the sequential manufacturing process of a semiconductor device according to an embodiment of the present disclosure.
Figure 26D:
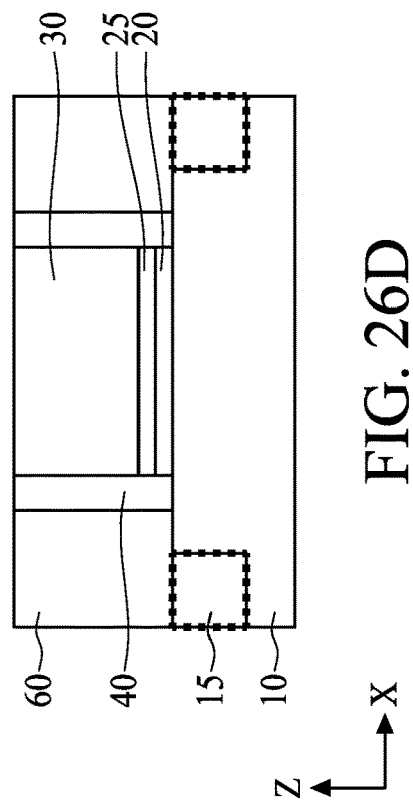
Figure 26A:
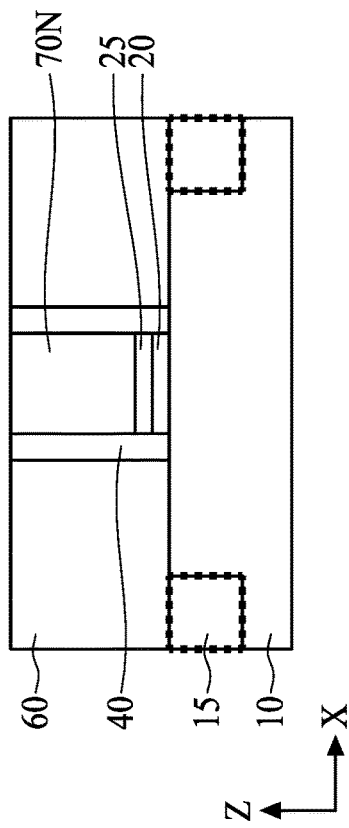
Figure 26C:
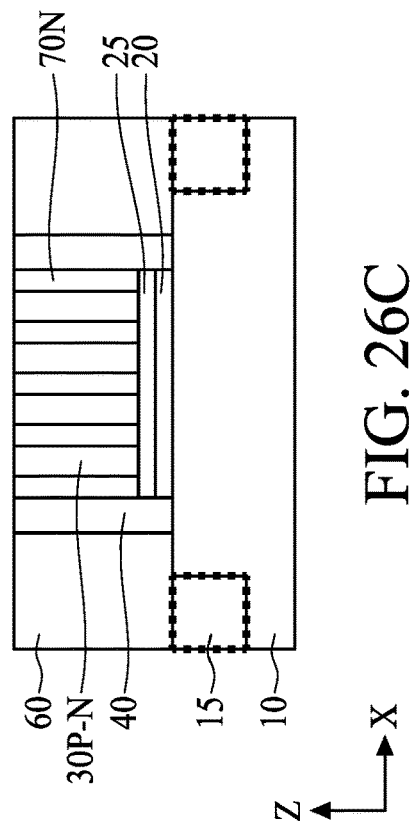

After the mask pattern 45 is removed, one or more conductive materials are formed in the gate spaces for the short channel NFET and the long channel NFET as shown in FIGS. 26A and 26C. As shown in FIG. 26C, one or more pillars or walls 30P-N similar to the pillars or walls 30P as shown in FIGS. 15A-15D are formed in the metal gate electrode 70N for the long channel NFET, while no pillar or wall is formed in the metal gate electrode 70N for the short channel NFET as shown in FIG. 26A. In some embodiments, the metal gate electrode 70N for the NFET includes one or more n-type work function adjustment layers. As shown in FIGS. 26B and 26D, the sacrificial gate electrode layer 30 remains for the short channel PFET and the long channel PFET.

Figure 27A:
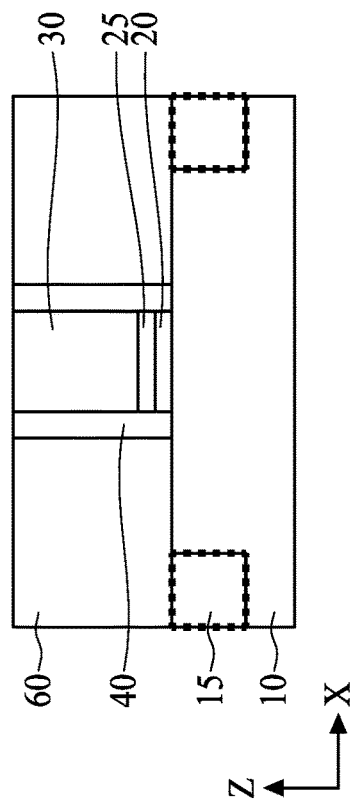
FIGS. 27A, 27B, 27C and 27D shows various view of one of the sequential manufacturing process of a semiconductor device according to an embodiment of the present disclo
Figure 27B:
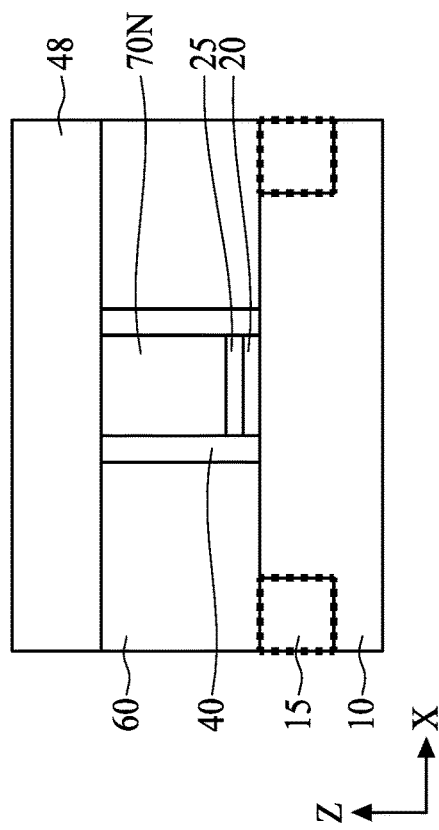
Figure 27C:
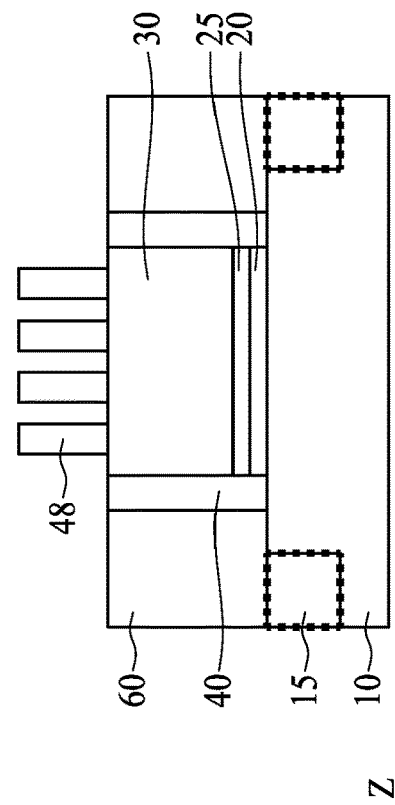
Figure 27D:
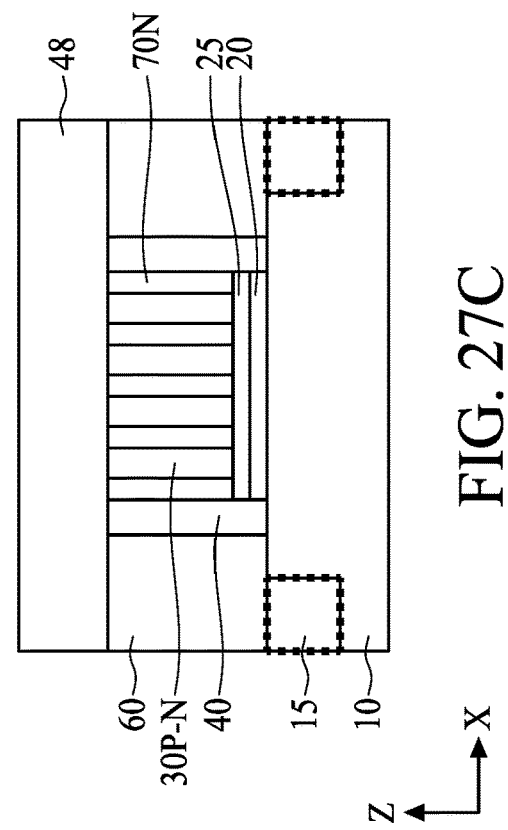

Next, as shown in FIGS. 27A-27D, a mask pattern 48 is formed. In some embodiments, the mask pattern 48 is a photo resist pattern. In some embodiments, as shown in FIGS. 27A and 27C, the mask pattern 48 fully covers (protects) the metal gate electrode 70N for the NFETs. In some embodiments, the mask pattern 48 includes a pattern for pillars/walls formed over the sacrificial gate electrode layer 30 for the long channel PFET as shown in FIG. 27D. In some embodiments, no pattern is formed over the sacrificial gate electrode layer 30 for the short channel PFET as shown in FIG. 27B.

Figure 28A:
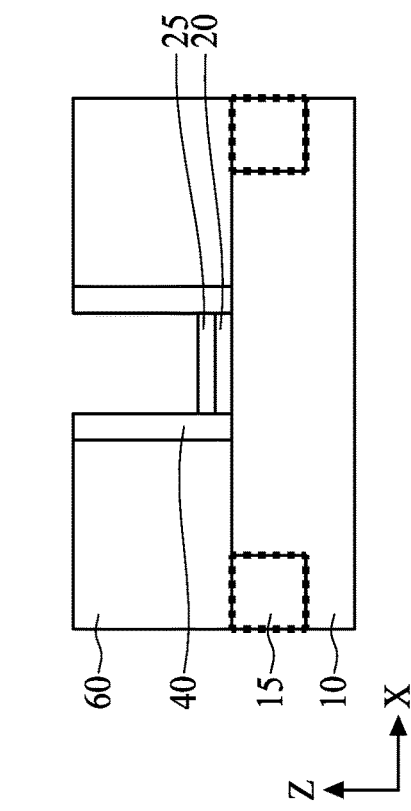
- FIGS. 28A, 28B, 28C and 28D shows various view of one of the sequential manufacturing process of a semiconductor device according to an embodiment of the present disclosure.
Figure 28B:
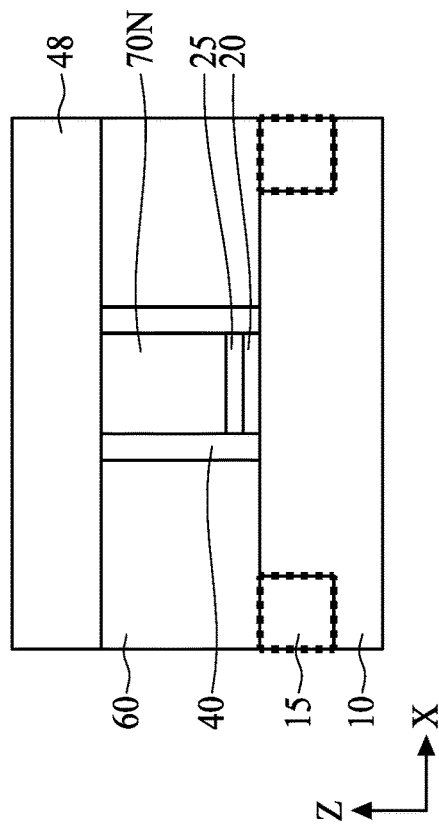
Figure 28C:
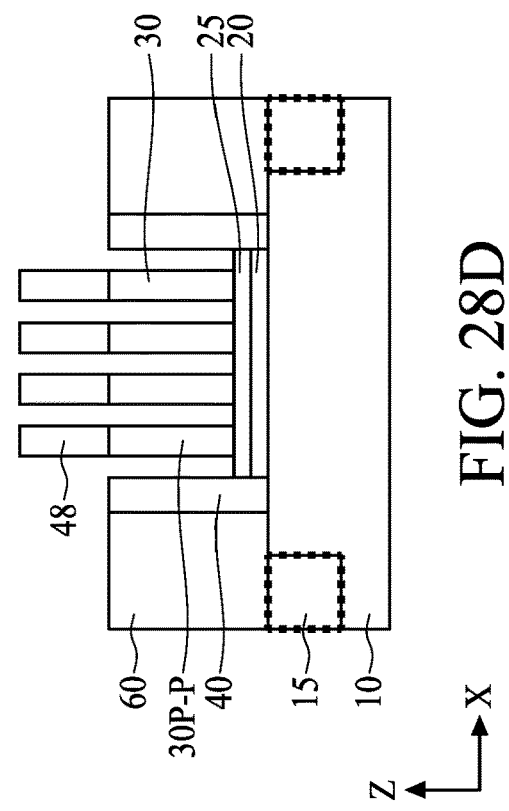
Figure 28D:
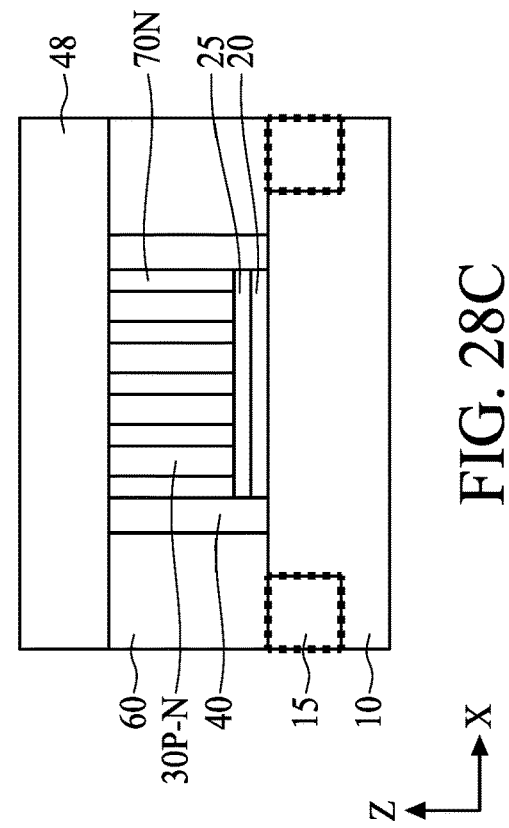

Then, the sacrificial gate electrode layer 30 for the PFETs is etched by using the mask pattern 48 as an etching mask. As shown in FIG. 28D, one or more pillars or walls 30P-P are formed in the gate space 32 for the long channel PFET, and as shown in FIG. 28B, the sacrificial gate electrode layer 30 is fully removed for the short channel PFET.

Figure 29B:
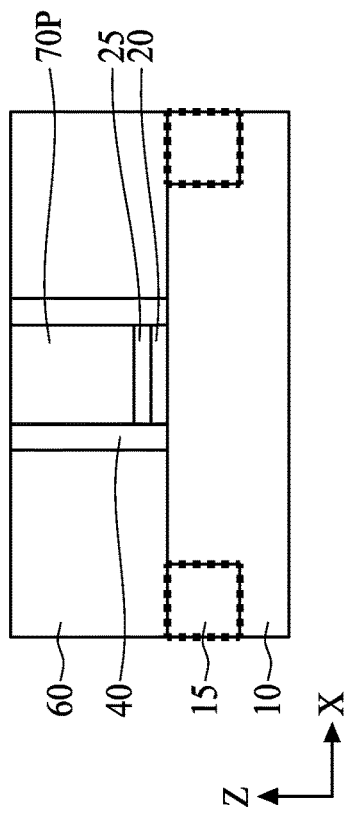
FIGS. 29A, 29B, 29C and 29D shows various view of one of the sequential manufacturing process of a semiconductor device according to an embodiment of the present disclosure.
Figure 29A:
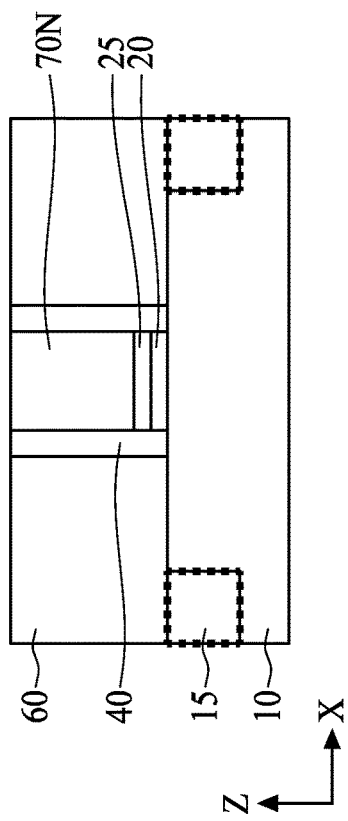
Figure 29D:
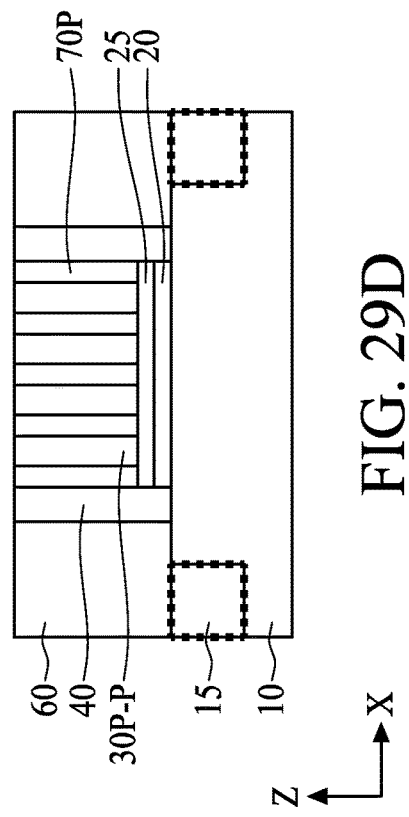
Figure 29C:
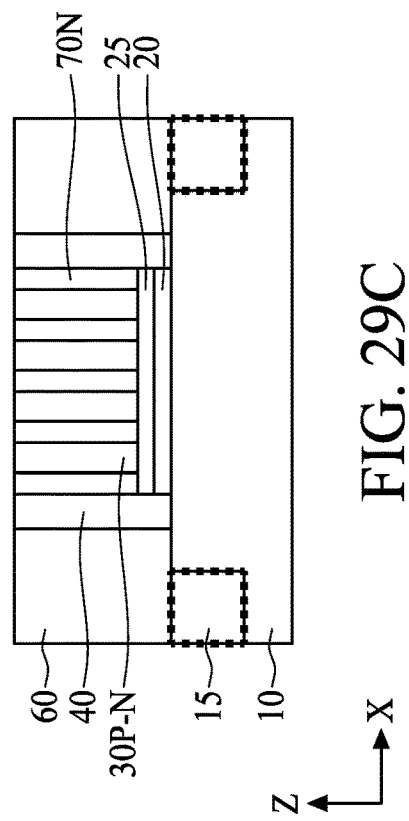

After the mask pattern 48 is removed, one or more conductive materials are formed in the gate spaces for the short channel PFET and the long channel PFET as shown in FIGS. 29B and 29D. As shown in FIG. 29D, one or more pillars or walls 30P-P similar to the pillars or walls 30P as shown in FIGS. 15A-15D are formed in the metal gate electrode 70P for the long channel PFET, while no pillar or wall is formed in the metal gate electrode 70P for the short channel PFET as shown in FIG. 26A. In some embodiments, the metal gate electrode 70P for the PFET includes one or more p-type work function adjustment layers, and the layer structure of the metal gate electrode 70N is different from the layer structure of the metal gate electrode 70P.

When different metal layer structures are employed for PFETs and NFETs, at least two photo lithography processes are used. In the foregoing embodiments, since pillar or wall patterns are included in the photo resist patterns for such photo lithography processes, it is possible to form the pillars or walls without adding extra photo lithography processes.

Figure 30A:
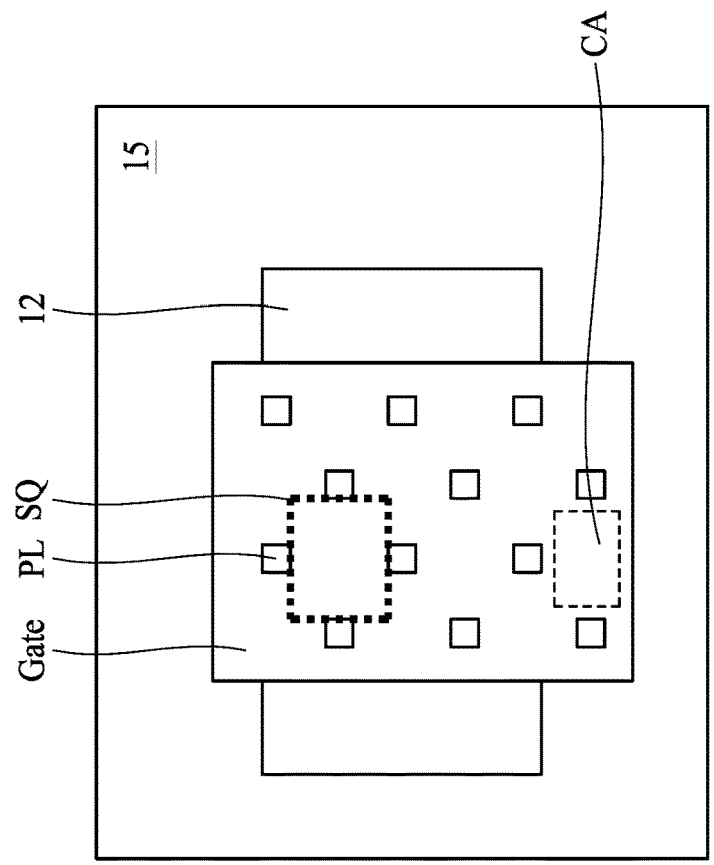
FIGS. 30A and 30B show plan views of a semiconductor device according to embodiments of the present disclosure.
Figure 30B:
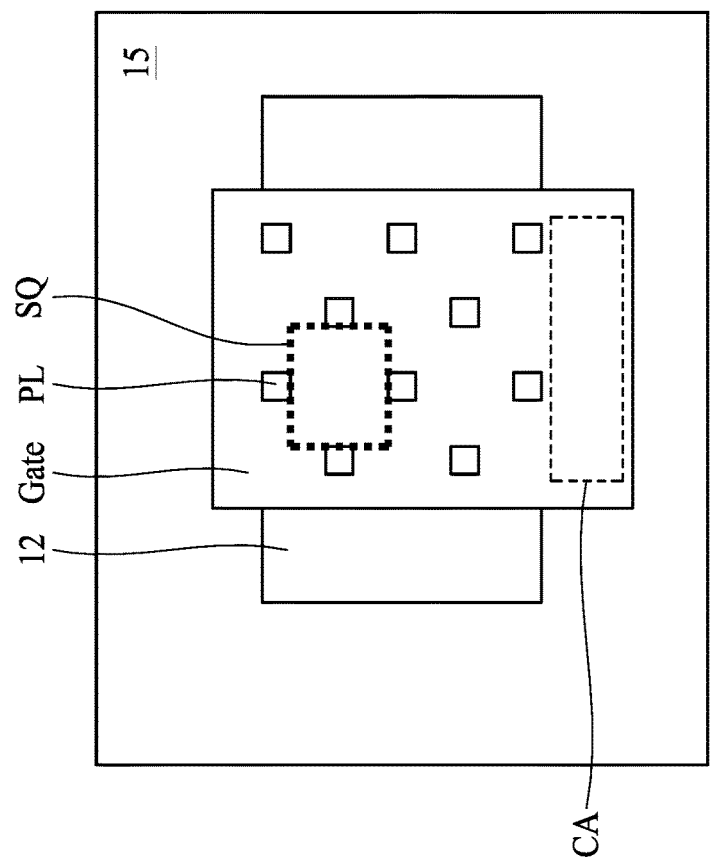

FIGS. 30A and 30B show various layout view (top view) of pillars or walls PL according to some embodiments of the present disclosure.

As set forth above, when a gate electrode has a large area in plan view, a dishing issue may be observed. To suppress the dishing, one or more pillars or walls PL are disposed in the gate space before a CMP operation for a metal gate electrode. In some embodiments, the pillar or walls are arranged such that no square area SQ more than a threshold area exists in the gate electrode in plan view. In some embodiments, the threshold area is in a range from about 0.1 $\mu m^2$ to about 2.0 $\mu m^2$, depending on the CMP conditions, topography and/or materials to be polished.

In some embodiments, a contact area CA for the gate contact is provided as shown in FIGS. 30A and 30B. In some embodiments, the contact area CA is disposed over the isolation structure 15 and no pillar or wall is provided over the isolation structure 15 as shown in FIG. 30A. In some embodiments, no pillar or wall is provided on the contact area and some of the pillars or walls are provided over the isolation structure 15 as shown in FIG. 30B.

In some embodiments, an area of each of the pillars or walls is in a range from about 0.01 $\mu m^2$ to about 1.0 $\mu m^2$. In some embodiments, the total area of the pillars or wall in plan view with respect to the total area (L×W) of the gate electrode is in a range from about 1% to about 25%. If the total area of the pillars or walls is below the range, the structural support (stopping effect) in the CMP operation for the gate metal may be insufficient and dishing may occur. If the total area of the pillars or walls is above the range, a threshold voltage (Vt) may undesirably increase.

FIGS. 31A-34D show various layouts of the pillars or walls according to embodiments of the present disclosure. The shape and/or arrangements of the pillars or walls PL in one embodiment can be applied to other embodiments.

In some embodiments, the pillars or walls PL, which correspond to pillars or walls 60P, 62), 30P 30P-N and/or 30P-P as explained above, have substantially square shape in plan view and are arranged in a matrix as shown in FIG. 31A. In some embodiments, the pillars or walls PL are arranged in a staggered matrix as shown in FIG. 31B. In some embodiments, the pillars or walls PL are arranged randomly as shown in FIG. 31C. In FIGS. 31A-31C, the length of the sides is in a range from about 0.1 µm to about 1.0 µm in some embodiments. The square shape has rounded corners in some embodiments.

Figure 31E:
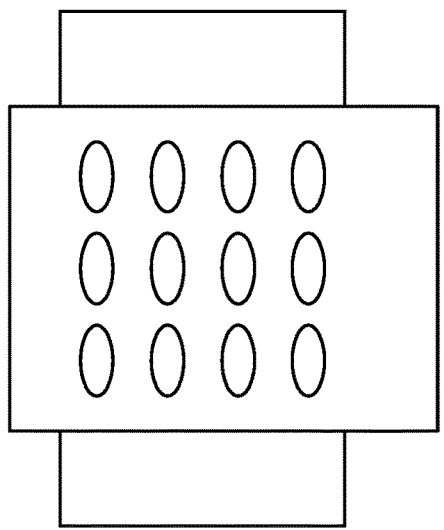

In some embodiments, the pillars or walls PL have a circular shape in plan view as shown in FIG. 31D, and have an oval shape in plan view as shown in FIG. 31E. In some embodiments, circularity (the shortest diameter to the longest diameter) is about 0.7 to 1.0 (circular). In some embodiments, the diameter (the longest diameter) is in a range from about 0.1 µm to about 1.0 µm.

Figure 32A:
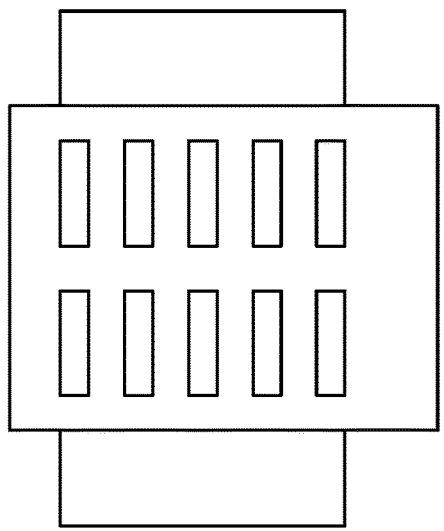
FIGS. 32A, 32B and 32C show plan views of a semiconductor device according to embodiments of the present disclosure.
Figure 32C:
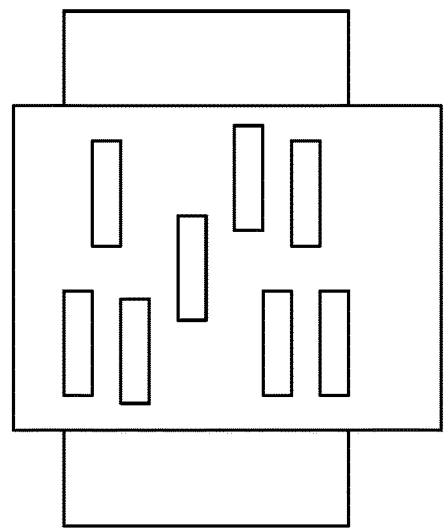
Figure 32B:
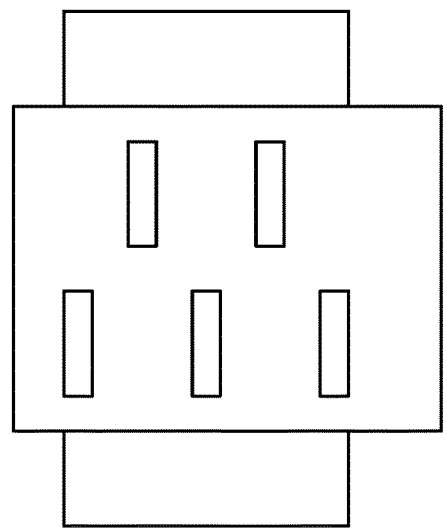

In some embodiments, the pillars or walls PL have a rectangular shape as shown in FIGS. 32A-32C. In some embodiments, the rectangular shape has short sides in a range from about 0.1 µm to about 1.0 µm and long side in a range from about 0.4 µm to about 20 µm. In some embodiments, the aspect ratio (long side to short side) is about 4 to about 20. In some embodiments, the pillars or walls PL are arranged in a regular matrix as shown in FIG. 32A, or in a staggered matrix as shown in FIG. 32B. In some embodiments, the pillars or walls PL are arranged randomly as shown in FIG. 32C.

Figure 33A:
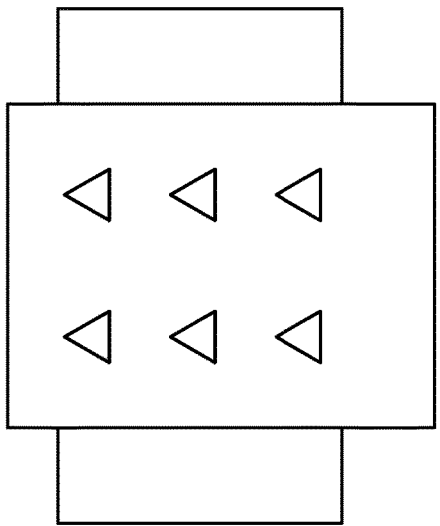
FIGS. 33A, 33B, 33C and 33D show plan views of a semiconductor device according to embodiments of the present disclosure.
Figure 33B:
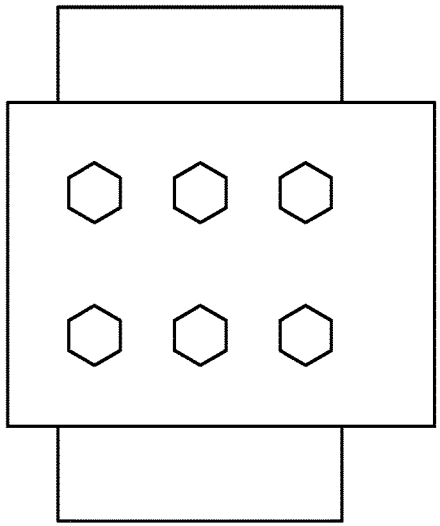
Figure 33C:
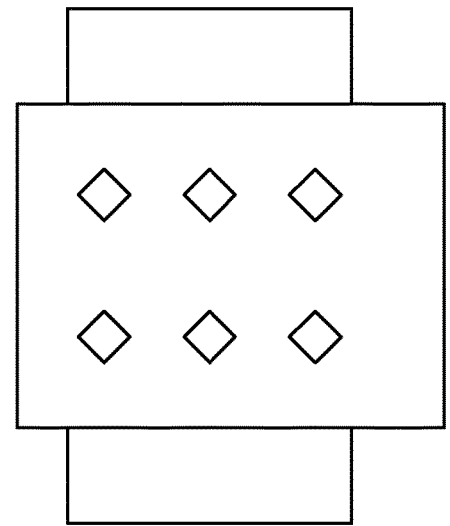

In some embodiments, the pillars or walls PL have a polygonal shape as shown in FIGS. 33A-33C. In some embodiments, the pillars or walls PL have a triangular shape as shown in FIG. 33A, a hexagonal shape as shown in FIG. 33B or a diamond shape as shown in FIG. 33C.

Figure 33D:
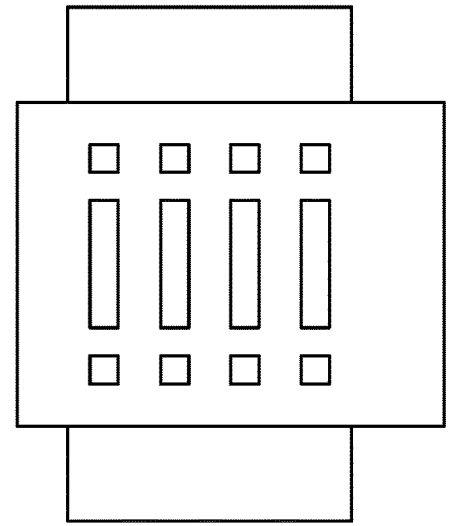

In some embodiments, two or more shapes as explained above are used together. In some embodiments, square shape pillars and rectangular shape walls are used together as shown in FIG. 33D.

In some embodiments, the pillars or walls PL are long rectangular walls as shown in FIGS. 34A-34D. In some embodiments, the long rectangular walls PL extend in the Y direction and arranged regularly in the X direction (source-to-drain direction) as shown in FIG. 34A. In some embodiments, the walls PL are disposed only above the channel region, as shown in FIG. 34A. In other embodiments, the walls PL are also disposed above the isolation structure, as shown in FIG. 34B. In some embodiments, one end of the wall PL is in contact with the gate sidewall spacer so that the remaining metal gate electrode has a comb shape in plan view as shown in FIG. 34B. In the comb shape metal gate electrode, the conductive cap layer 25 does not have a comb shape and is fully continuous over the gate dielectric layer 20.

In some embodiments, the long rectangular walls PL extend in the X direction and are regularly arranged in the Y direction as shown in FIG. 34C. In some embodiments, the walls PL are disposed only above the channel region, as shown in FIG. 34C. In other embodiments, the walls PL are also disposed above the isolation structure, as shown in FIG. 34D. In some embodiments, one end of the wall PL is in contact with the gate sidewall spacer so that the remaining metal gate electrode has a comb shape in plan view as shown in FIG. 34D.

In some embodiments, the metal gate electrode 70 does not have fully segmented part by an insulating material (no part is fully surrounded by an insulating material (the pillar or sidewall) in plan view).

According to the foregoing embodiments, since pillars or walls are provided in the gate space, which can function as an etch stop layer, dishing of a metal gate electrode is effectively suppressed.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a gate dielectric layer is formed over a substrate, a sacrificial layer is formed over the gate dielectric layer, the sacrificial layer is patterned to form a sacrificial gate electrode, a plurality of openings are formed in the sacrificial gate electrodes by partially etching the sacrificial gate electrode, the plurality of openings are filled with a filling material different from a material of the sacrificial gate electrode, the sacrificial gate electrode is removed to form a gate space, thereby leaving a plurality of pillars or walls in a gate space, and the gate space is filled with one or more conductive materials, thereby forming a metal gate electrode. In one or more of the foregoing and following embodiments, the sacrificial gate electrode includes polysilicon or amorphous silicon. In one or more of the foregoing and following embodiments, the filling material is a dielectric material. In one or more of the foregoing and following embodiments, the filling material includes one or more of silicon oxide, silicon nitride, SiON, SiOC, SiOCN or SiCN. In one or more of the foregoing and following embodiments, a cap layer made of a conductive material is further formed over the gate dielectric layer before the sacrificial layer is formed. In one or more of the foregoing and following embodiments, the plurality of pillars or walls and the one or more conductive materials are formed over the cap layer. In one or more of the foregoing and following embodiments, before the plurality of openings are formed, sidewall spacers are formed on sidewalls of the sacrificial gate electrode. In one or more of the foregoing and following embodiments, after the plurality of openings are formed, sidewall spacers are formed on sidewalls of the sacrificial gate electrode. In one or more of the foregoing and following embodiments, the plurality of pillars or walls includes a bottom layer made of a same material as the sidewall spacers, and an upper layer made of the filling material. In one or more of the foregoing and following embodiments, when the gate space is filled with the one or more conductive materials, a blanket layer of the one or more conductive materials is formed, a chemical mechanical polishing (CMP) operation is performed on the one or more conductive materials. In one or more of the foregoing and following embodiments, the CMP operation stops at the plurality of pillars or walls. In one or more of the foregoing and following embodiments, the metal gate electrode has a width W and a length L in plan view and a gate area W×L is equal to or more than 3 $\mu m^2$. In one or more of the foregoing and following embodiments, a total area of the plurality of pillars or walls in plan view is 1% to 25% of the gate area.

In accordance with another aspect of the present disclosure, in a method manufacturing a semiconductor device, a gate dielectric layer is formed over a substrate, a sacrificial layer is formed over the gate dielectric layer, the sacrificial layer is patterned to form a sacrificial gate electrode, a sidewall spacer is formed on a sidewall of the sacrificial gate electrode, an interlayer dielectric layer is formed over the sidewall spacer, the sacrificial gate electrode is patterned, thereby forming a plurality of pillars or walls in a gate space, one or more conductive layers are formed in the gate space and over the interlayer dielectric layer, and a chemical mechanical polishing (CMP) process is performed on the one or more conductive layers, thereby forming a metal gate electrode. In one or more of the foregoing and following embodiments, a cap layer made of a conductive material is further formed over the gate dielectric layer before the sacrificial layer is formed. In one or more of the foregoing and following embodiments, the plurality of pillars or walls are formed over the cap layer. In one or more of the foregoing and following embodiments, the cap layer is made of TiN. In one or more of the foregoing and following embodiments, the plurality of pillars or walls are made of polysilicon. In one or more of the foregoing and following embodiments, an area of each of the plurality of pillars or wall in plan view is in a range from 0.01 $\mu m^2$ to 1.0 $\mu m^2$. In one or more of the foregoing and following embodiments, the gate electrode has a width W and a length L in plan view and W×L is equal to or more than 5 $\mu m^2$, and a total area of the plurality of pillars or walls in plan view is 1% to 25% of the gate area.

In accordance with another aspect of the present disclosure, in a method of manufacturing a semiconductor device, a gate dielectric layer is formed over a substrate, a sacrificial layer is formed over the gate dielectric layer, the sacrificial layer is patterned to form a first sacrificial gate electrode and a second sacrificial gate electrode, a sidewall spacer is formed on a sidewall of each of the first and second sacrificial gate electrodes, an interlayer dielectric layer is formed over the sidewall spacer, the first sacrificial gate electrode is removed, thereby forming a first gate space and the second sacrificial gate electrode is patterned, thereby forming a plurality of pillars or walls in a second gate space, one or more conductive layers are formed in the first and second gate spaces and over the interlayer dielectric layer, and a chemical mechanical polishing is performed on the one or more conductive layers, thereby forming a first metal gate electrode with no pillar or wall and a second metal gate electrode with the plurality of pillars or walls. In one or more of the foregoing and following embodiments, a gate length of the first metal gate electrode is smaller than a gate length of the second metal gate electrode. In one or more of the foregoing and following embodiments, an area of the first metal gate electrode in plan view is smaller than an area of the second metal gate electrode in plan view. In one or more of the foregoing and following embodiments, the area of the second metal gate electrode is equal to or more than 3 $\mu m^2$.

In accordance with another aspect of the present disclosure, a semiconductor device includes a substrate including a channel region, a source region and a drain region; a gate dielectric layer disposed over the channel region; and a gate electrode disposed over the gate dielectric layer. The gate electrode includes a conductive body layer and a plurality of pillars or walls made of a different material than the conductive body and surrounded by the conductive body in plan view. In one or more of the foregoing and following embodiments, the semiconductor device further includes a conductive cap layer between the gate electrode and the gate dielectric layer. In one or more of the foregoing and following embodiments, the conductive cap layer includes TiN. In one or more of the foregoing and following embodiments, a bottom of the conductive body and bottoms of the plurality of pillars or walls are in contact with the conductive cap layer. In one or more of the foregoing and following embodiments, the plurality of pillars or walls are made of a dielectric material. In one or more of the foregoing and following embodiments, the gate electrode has a width W and a length L in plan view and W×L is equal to or more than 3 $\mu m^2$. In one or more of the foregoing and following embodiments, the plurality of pillars or walls are arranged in a matrix in plan view. In one or more of the foregoing and following embodiments, the matrix is a staggered matrix. In one or more of the foregoing and following embodiments, wherein a top view of each of the plurality of pillars or walls is a rectangle, a circle or an oval. In one or more of the foregoing and following embodiments, the plurality of pillars or walls include a first group and a second group, and a top view of each of pillars of the first group is different from a top view of each of pillars of the second group. In one or more of the foregoing and following embodiments, a total area of the plurality of pillars or walls in a plan view is equal to or more than 1% and equal to or less than 25% of a total area of the gate electrode in plan view. In one or more of the foregoing and following embodiments, the semiconductor device further includes an isolation insulating layer surrounding the source region, the channel region and the drain region. In one or more of the foregoing and following embodiments, no pillar or wall is disposed over the isolation insulating layer. In one or more of the foregoing and following embodiments, the semiconductor device further includes a gate sidewall spacer disposed on a sidewall of the gate electrode. In one or more of the foregoing and following embodiments, the plurality of pillars or walls includes a first layer made of a same material as the gate sidewall spacer and a second layer made of a different material than the first layer. In one or more of the foregoing and following embodiments, the first layer is made of silicon nitride and the second layer is made of silicon oxide.

In accordance with another aspect of the present disclosure, a semiconductor device includes a substrate including a channel region, a source region and a drain region; a gate dielectric layer disposed over the channel region; and a metal gate electrode disposed over the gate dielectric layer. The gate electrode includes a conductive body layer made of a metal material and a plurality of pillars or walls made of a semiconductor material. In one or more of the foregoing and following embodiments, the semiconductor material is polysilicon or amorphous silicon. In one or more of the foregoing and following embodiments, an area of each of the plurality of pillars or wall in plan view is in a range from 0.01 $\mu m^2$ to 1.0 $\mu m^2$. In one or more of the foregoing and following embodiments, the gate electrode has a width W and a length L in plan view and W×L is equal to or more than 5 $\mu m^2$. In one or more of the foregoing and following embodiments, a total area of the plurality of pillars or walls in plan view is 1% to 25% of the gate area.

In accordance with another aspect of the present disclosure, a semiconductor device includes a first field effect transistor (FET); and a second FET. Each of the first and second FETs includes: a gate dielectric layer disposed over a channel region; and a metal gate electrode disposed over the gate dielectric layer. The gate electrode of the second FET includes a plurality of pillars or walls made of a semiconductor material or a dielectric material, and the gate electrode of the first FET includes no pillar or wall made of the semiconductor material or the dielectric material. In one or more of the foregoing and following embodiments, wherein an area of the metal gate electrode of the first FET in plan view is smaller than an area of the metal gate electrode of the second FET in plan view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a gate dielectric layer over a substrate;
    forming a sacrificial layer over the gate dielectric layer;
    patterning the sacrificial layer to form a sacrificial gate electrode;
    forming a plurality of openings in the sacrificial gate electrodes by partially etching the sacrificial gate electrode;
    filling the plurality of openings with a filling material different from a material of the sacrificial gate electrode;
    removing the sacrificial gate electrode to form a gate space, thereby leaving a plurality of pillars or walls in the gate space;
    filling the gate space with one or more conductive materials, thereby forming a metal gate electrode; and
    forming sidewall spacers on sidewalls of the sacrificial gate electrode,
    wherein the plurality of pillars or walls are located between a pair of the sidewall spacers in a cross section, and the pillars or walls penetrate through the metal gate electrode.

2. The method of claim 1, wherein the sacrificial gate electrode includes polysilicon or amorphous silicon.

3. The method of claim 1, wherein the filling material is a dielectric material.

4. The method of claim 3, wherein the filling material includes one or more of silicon oxide, silicon nitride, SiON, SiOC, SiOCN or SiCN.

5. The method of claim 1, further comprising forming a cap layer made of a conductive material over the gate dielectric layer before the sacrificial layer is formed,
wherein the plurality of pillars or walls and the one or more conductive materials are formed over the cap layer.

6. The method of claim 1, wherein the sidewall spacers are formed on the sidewalls of the sacrificial gate electrode before the plurality of openings are formed.

7. The method of claim 1, wherein the sidewall spacers are formed on the sidewalls of the sacrificial gate electrode after the plurality of openings are formed.

8. The method of claim 7, wherein the plurality of pillars or walls includes a bottom layer made of a same material as the sidewall spacers, and an upper layer made of the filling material.

9. The method of claim 1, wherein the filling the gate space with the one or more conductive materials comprises:
forming a blanket layer of the one or more conductive materials; and
performing a chemical mechanical polishing (CMP) operation on the one or more conductive materials,
wherein the CMP operation stops at the plurality of pillars or walls.

10. The method of claim 1, wherein the metal gate electrode has a width W and length L in plan view and a gate area W×L is equal to or more than 3 $\mu m^2$.

11. The method of claim 10, wherein a total area of the plurality of pillars or walls in plan view is 1% to 25% of the gate area.

12. A method of manufacturing a semiconductor device, comprising:
forming a gate dielectric layer over a substrate;
forming a sacrificial layer over the gate dielectric layer;
patterning the sacrificial layer to form a sacrificial gate electrode;
forming sidewall spacers on sidewalls of the sacrificial gate electrode as seen in a cross section;
forming an interlayer dielectric layer over the sidewall spacers;
patterning the sacrificial gate electrode, thereby forming a plurality of pillars or walls in a gate space between a pair of the sidewall spacers;
forming one or more conductive layers in the gate space and over the interlayer dielectric layer; and
performing a chemical mechanical polishing on the one or more conductive layers, thereby forming a metal gate electrode,
wherein the plurality of pillars or walls extend through an entire thickness of the one or more conductive layers.

13. The method of claim 12, further comprising forming a cap layer made of a conductive material over the gate dielectric layer before the sacrificial layer is formed,
wherein the plurality of pillars or walls are formed over the cap layer.

14. The method of claim 13, wherein the cap layer is made of TiN.

15. The method of claim 12, wherein the plurality of pillars or walls are made of polysilicon.

16. The method of claim 12, wherein an area of each of the plurality of pillars or wall in plan view is in a range from 0.01 $\mu m^2$ to 1.0 $\mu m^2$.

17. The method of claim 12, wherein:
the gate electrode has a width W and length L in plan view and a gate area W×L is equal to or more than 5 $\mu m^2$, and
a total area of the plurality of pillars or walls in plan view is 1% to 25% of the gate area.

18. A method of manufacturing a semiconductor device, comprising:
forming a gate dielectric layer over a substrate;
forming a sacrificial layer over the gate dielectric layer;
patterning the sacrificial layer to form a first sacrificial gate electrode and a second sacrificial gate electrode;
forming a sidewall spacer on a sidewall of each of the first and second sacrificial gate electrodes;
forming an interlayer dielectric layer over the sidewall spacer;
removing the first sacrificial gate electrode, thereby forming a first gate space and patterning the second sacrificial gate electrode, thereby forming a plurality of pillars or walls between a pair of sidewall spacers in a cross section in a second gate space;
forming one or more conductive layers in the first and second gate spaces and over the interlayer dielectric layer; and
performing a chemical mechanical polishing on the one or more conductive layers, thereby forming a first metal gate electrode with no pillar or wall and a second metal gate electrode with the plurality of pillars or walls,
wherein the plurality of pillars or walls extend through an entire thickness of the second metal gate electrode.

19. The method of claim 18, wherein a gate length of the first metal gate electrode is smaller than a gate length of the second metal gate electrode.

20. The method of claim 18, wherein:
an area of the first metal gate electrode in plan view is smaller than an area of the second metal gate electrode in plan view, and
the area of the second metal gate electrode is equal to or more than 3 $\mu m^2$.

* * * * *